United States Patent
Jung et al.

(10) Patent No.: US 10,824,012 B2
(45) Date of Patent: Nov. 3, 2020

(54) DISPLAY DEVICE AND METHOD OF MANUFACTURING THE SAME

(71) Applicant: Samsung Display Co., Ltd., Yongin-si (KR)

(72) Inventors: Jin Soo Jung, Hwaseong-si (KR); Young Gu Kim, Yongin-si (KR); Taek Joon Lee, Hwaseong-si (KR); Keun Chan Oh, Hwaseong-si (KR); Sun Young Chang, Bucheon-si (KR); Hye Lim Jang, Hwaseong-si (KR); Baek Kyun Jeon, Yongin-si (KR); Kyung Seon Tak, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 165 days.

(21) Appl. No.: 16/125,322

(22) Filed: Sep. 7, 2018

(65) Prior Publication Data

US 2019/0219875 A1 Jul. 18, 2019

(30) Foreign Application Priority Data

Jan. 18, 2018 (KR) ........................ 10-2018-0006683

(51) Int. Cl.
*G02F 1/1335* (2006.01)
*G02F 1/13357* (2006.01)
(Continued)

(52) U.S. Cl.
CPC .. *G02F 1/133617* (2013.01); *G02F 1/133514* (2013.01); *H01L 27/322* (2013.01);
(Continued)

(58) Field of Classification Search
CPC ... G02F 2001/133614; G02F 1/133617; G02F 1/133514; H01L 51/5275; H01L 27/322; H01L 27/3244
(Continued)

(56) References Cited

U.S. PATENT DOCUMENTS 9,541,682 B2 *   1/2017  Isojima ................... F21V 5/002
2017/0313897 A1* 11/2017  Kotani ...................... B05D 7/24
(Continued)

FOREIGN PATENT DOCUMENTS

KR  10-2016-0017373   2/2016
KR  10-2017-0049383   5/2017
WO  WO 2016/047740 A1 3/2016

OTHER PUBLICATIONS

Thomas, Ian M.; Method for the preparation of porous silica antireflection coatings varying in refractive index from 1.22 to 1.44, Applied Optics, vol. 31, No. 28, Oct. 1, 1992, pp. 6145-6149.

*Primary Examiner* — William R Alexander
(74) *Attorney, Agent, or Firm* — Lewis Roca Rothgerber Christie LLP

(57) ABSTRACT

A display device and a method of manufacturing a display device are provided. The display device includes: a base substrate; a color conversion pattern disposed on the base substrate; and a low refractive layer disposed on the base substrate, stacked with the color conversion pattern, and having a lower refractive index than the color conversion pattern. The low refractive layer includes a first base resin and particle clusters dispersed in the first base resin, and the particle clusters include a plurality of particles and bridges that combine the particles.

15 Claims, 31 Drawing Sheets

(51) Int. Cl.
*H01L 27/32* (2006.01)
*H01L 51/52* (2006.01)
(52) U.S. Cl.
CPC ............... *H01L 51/5275* (2013.01); *G02F 2001/133614* (2013.01); *H01L 27/3244* (2013.01)
(58) Field of Classification Search
USPC ........................................................ 359/885
See application file for complete search history.

(56) References Cited

U.S. PATENT DOCUMENTS

2017/0321115 A1\* 11/2017 Satake .................... C09K 11/02
2018/0046080 A1\* 2/2018 Suzuki .................... C09K 11/08
2018/0284613 A1\* 10/2018 Hirayama ................. G03F 7/32
2019/0121176 A1 4/2019 Lee et al.
2019/0341409 A1\* 11/2019 Yamabi ............. H01L 27/14632

\* cited by examiner

FIG. 2
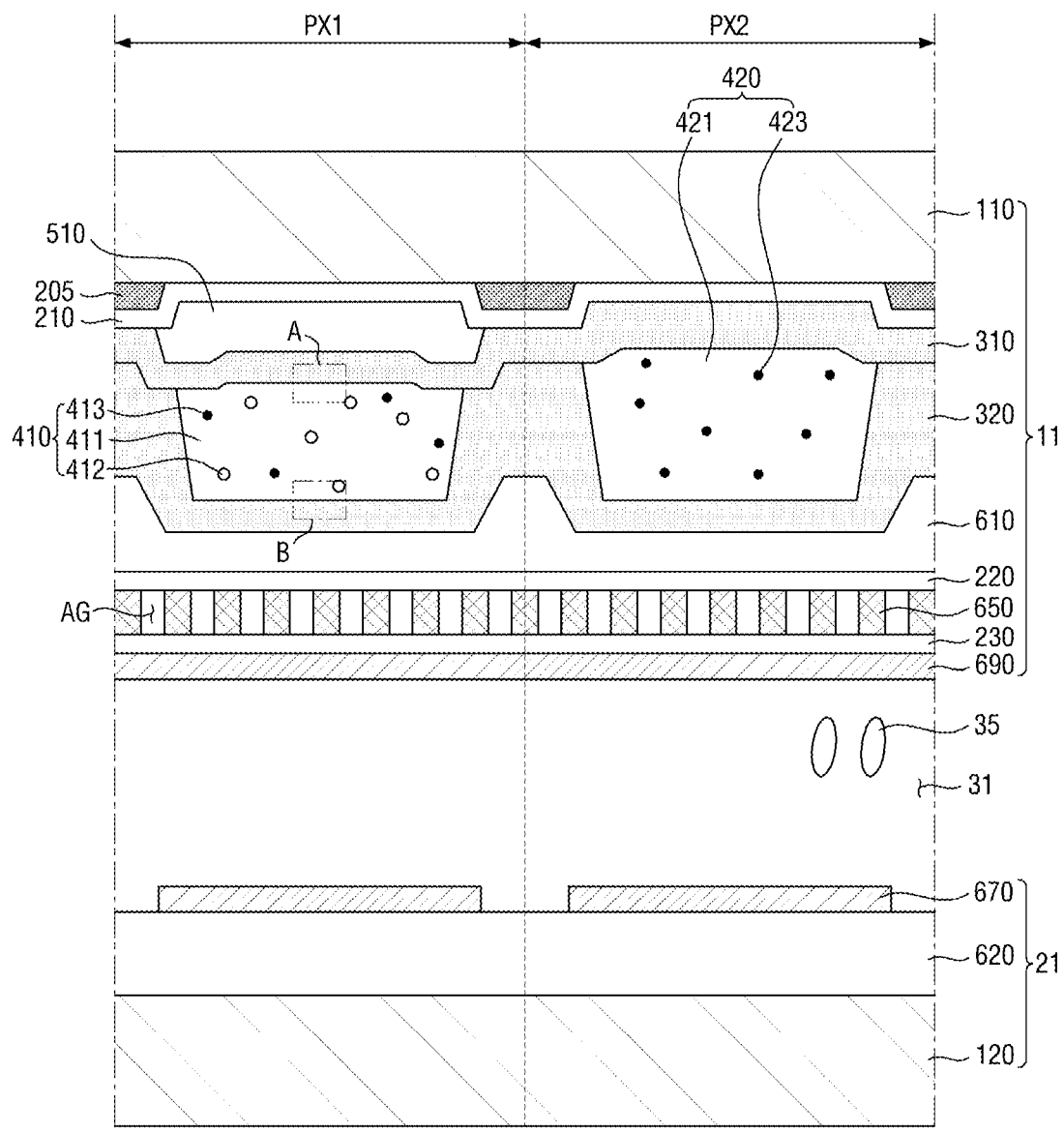

DISPLAY DEVICE AND METHOD OF MANUFACTURING THE SAME

CROSS-REFERENCE TO RELATED APPLICATION

This application claims priority to and the benefit of Korean Patent Application No. 10-2018-0006683, filed on Jan. 18, 2018, in the Korean Intellectual Property Office, the entire disclosure of which is incorporated herein by reference.

BACKGROUND

1. Field

The present disclosure relates to a display device and a method of manufacturing the display device.

2. Description of the Related Art

In accordance with developments in multimedia technology, display devices have become increasingly important, and various display devices (e.g., various types of display devices) such as liquid crystal display (LCD) devices, organic light-emitting diode (OLED) display devices, etc., have been used.

The LCD device includes: an LCD panel having field-generating electrodes (such as pixel electrodes and a common electrode) and a liquid crystal layer in which an electric field is generated by the field-generating electrodes; and a light source unit providing light to the LCD panel. The LCD device displays an image by applying voltages to the field-generating electrodes to realign liquid crystals in the liquid crystal layer and thus to control the amount of light passing through the liquid crystal layer for each pixel.

The OLED display device includes a plurality of OLEDs, which are disposed in a plurality of pixels and are controllable independently. Each of the OLEDs includes two electrodes and an organic light-emitting layer, which is interposed between the two electrodes. The OLEDs, which are self-emitting elements, may serve as light sources.

As one method to allow each pixel to display one unique color, a color conversion pattern may be disposed, for each pixel, on the path of light from a light source unit to a viewer.

SUMMARY

The color conversion pattern may convert the color of incident light and may output light having a different color from the incident light. Examples of the color conversion pattern include a patterned structure having wavelength shifters such as quantum dots dispersed therein. The color conversion efficiency of the color conversion pattern is one of the most important factors that affect the display quality of a display device, for example, color reproducibility and luminance. In order to improve the color conversion efficiency of the color conversion pattern, a material having an excellent color conversion efficiency may be used, or the thickness of the color conversion pattern may be increased. However, there is a limit (e.g., a clear limit) in not only the efficiency of the color conversion material, but also the thickness of the color conversion pattern.

Aspects of embodiments of the present disclosure are directed toward a display device capable of improving the efficiency of color conversion with color conversion patterns and thus having an improved color reproducibility and luminance.

Aspects of embodiments of the present disclosure are also directed toward a method of manufacturing a display device with an improved color reproducibility and luminance.

However, aspects of embodiments of the present disclosure are not restricted to the ones set forth herein. The above and other aspects of embodiments of the present disclosure will become more apparent to one of ordinary skill in the art to which the present disclosure pertains by referencing the detailed description provided below.

According to an exemplary embodiment of the present disclosure, a display device includes: a base substrate; a color conversion pattern on the base substrate; and a low refractive layer on the base substrate, stacked with the color conversion pattern, and having a lower refractive index than the color conversion pattern, wherein the low refractive layer includes a first base resin, and particle clusters dispersed in the first base resin and including a plurality of particles and bridges combining the particles.

In an exemplary embodiment, the color conversion pattern and the low refractive layer may be in contact with each other to form an optical interface, a surface of the low refractive layer contacting the color conversion pattern may be an uneven surface.

In an exemplary embodiment, the uneven surface of the low refractive layer may be formed by the particle clusters.

In an exemplary embodiment, the color conversion pattern may include: a second base resin, and wavelength shifters dispersed in the second base resin, wherein a refractive index of the second base resin is at least 0.3 higher than the refractive index of the low refractive layer.

In an exemplary embodiment, pores may be defined between the particles of the particle clusters, and the refractive index of the low refractive layer may be 1.1 to 1.4.

In an exemplary embodiment, the particles may be silica particles.

In an exemplary embodiment, the bridges may include polysiloxane bonds.

In an exemplary embodiment, the first base resin may include a siloxane polymer, a weight-average molecular weight of the siloxane polymer may be about 100 to about 10,000 g/mol, and the siloxane polymer may have a fluorine-substituted side chain.

In an exemplary embodiment, the silica particles may be non-hollow silica particles, and a size of the silica particles may be about 10 nm to about 30 nm.

In an exemplary embodiment, the low refractive layer may include a first low refractive layer between the base substrate and the color conversion pattern, or a second low refractive layer on the color conversion pattern.

In an exemplary embodiment, the display device may further include: a first wavelength band filter between the base substrate and the first low refractive layer, wherein the first wavelength band filter may be configured to selectively absorb blue-wavelength light.

In an exemplary embodiment, the first wavelength band filter may include an organic material, and the first wavelength band filter may be in contact with the first low refractive layer.

In an exemplary embodiment, a refractive index of the first wavelength band filter may be at least 0.3 higher than a refractive index of the first low refractive layer.

In an exemplary embodiment, the display device may further include: a second wavelength band filter between the color conversion pattern and the second low refractive layer, wherein the second low refractive layer may be configured to cover side surface of the color conversion pattern, and the second wavelength band filter may be configured to selectively reflect green-wavelength light or blue-wavelength light.

In an exemplary embodiment, the second wavelength band filter may be a Bragg reflector including one or more first inorganic layers and one or more second inorganic layers alternately stacked.

In an exemplary embodiment, the second wavelength band filter may be in contact with the color conversion pattern and the second low refractive layer.

In an exemplary embodiment, the first inorganic layers may have a refractive index of 1.7 or higher, the second inorganic layers may have a refractive index of 1.5 or lower.

In an exemplary embodiment, a lowermost layer of the second wavelength band filter in contact with the color conversion pattern and an uppermost layer of the second wavelength band filter in contact with the second low refractive layer both may include the first inorganic layers.

In an exemplary embodiment, the display device may further include a first pixel to display a first color and a second pixel to display a second color different from the first color, and an organic layer on the second low refractive layer and including an organic material, wherein the first low refractive layer, the second low refractive layer, and the organic layer may be all across the first and second pixels.

According to an exemplary embodiment of the present disclosure, a method of manufacturing a display device includes: preparing particle clusters and a siloxane polymer, the particle clusters including a plurality of particles and bridges combining the particles; preparing a dispersion by dispersing the particle clusters and the siloxane polymer in a solvent; and applying the dispersion on a base substrate and heat-treating the dispersion applied on the base substrate, wherein the bridges include polysiloxane bonds.

In an exemplary embodiment, the preparing of the particle clusters and the siloxane polymer may include preparing silica particles and a silanol compound, and forming silica particle clusters and the siloxane polymer by mixing and dehydrating the silica particles and the silanol compound.

In an exemplary embodiment, a mixing weight ratio of the silica particles to the silanol compound may be 7:3 to 9:1, and a size of the silica particle clusters may be about 50 nm to about 1,000 nm.

In an exemplary embodiment, in the preparing of the dispersion, a weight ratio of the solvent to the dispersion may be about 90 wt % to about 98 wt %.

According to another exemplary embodiment of the present disclosure, a method of manufacturing a display device includes: preparing non-hollow silica particles and a siloxane polymer; preparing a dispersion by dispersing the silica particles and the siloxane polymer in a solvent; and applying the dispersion on a base substrate and heat-treating the dispersion applied on the base substrate, wherein a size of the silica particles is about 10 nm to about 30 nm.

In an exemplary embodiment, in the preparing of the dispersion, a weight ratio of the silica particles to the siloxane polymer may be about 7:3 to about 9:1, and a weight-average molecular weight of the siloxane polymer may be about 100 to about 10,000 g/mol.

In an exemplary embodiment, the heat-treating of the dispersion may include, heat-treating the dispersion at a temperature of about 180° C. to about 250° C., and in the heat-treating of the dispersion, bonds may be formed between the silica particles and the siloxane polymer.

According to the aforementioned and other exemplary embodiments of the present disclosure, at least some light transmitted through color conversion patterns can be recycled using an optical interface between a low refractive layer and the color conversion patterns, and as a result, the efficiency of color conversion can be further enhanced.

Other features and aspects of exemplary embodiments of the present disclosure may be apparent from the following detailed description, the drawings, and the claims.

BRIEF DESCRIPTION OF THE DRAWINGS

The above and other aspects and features of exemplary embodiments of the present disclosure will become more apparent by describing, in detail, exemplary embodiments thereof with reference to the attached drawings, in which:

FIG. 2 is a cross-sectional view of arbitrary pixels of the display device of FIG. 1;

DETAILED DESCRIPTION

Figure 1:
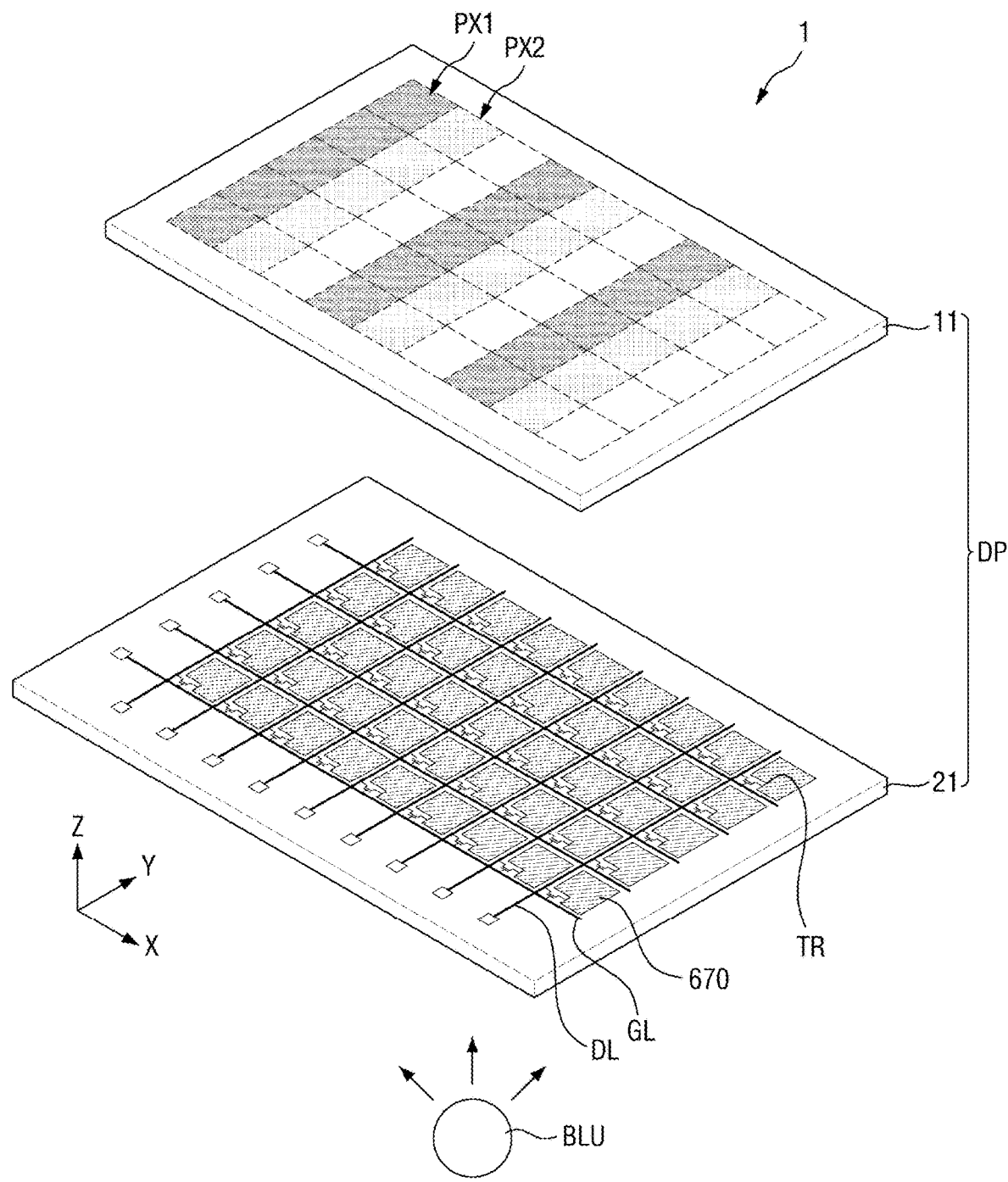
FIG. 1 is an exploded perspective view of a display device according to an exemplary embodiment.

Aspects and features of exemplary embodiments of the present disclosure and methods of accomplishing the same may be understood more readily by reference to the following detailed description and the accompanying drawings. The present disclosure may, however, be embodied in many different forms and should not be construed as being limited to the exemplary embodiments set forth herein. Rather, these embodiments are provided so that this disclosure will be thorough and complete and will fully convey the concept of the present disclosure to those skilled in the art. The present disclosure is defined by the appended claims and their equivalents.

It will be understood that when an element or layer is referred to as being "on," "connected to," or "coupled to" another element or layer, the element or layer can be directly on, connected to, or coupled to another element or layer or intervening elements or layers may be present. When an element is referred to as being "directly on," "directly connected to," or "directly coupled to" another element or layer, there are no intervening elements or layers present. As used herein, connected and coupled may refer to elements being physically, electrically, and/or fluidly connected to each other.

The same reference numerals designate the same elements. As used herein, the term "and/or" includes any and all combinations of one or more of the associated listed items. Further, the use of "may" when describing embodiments of the present invention relates to "one or more embodiments of the present invention." Expressions, such as "at least one of," when preceding a list of elements, modify the entire list of elements and do not modify the individual elements of the list. Also, the term "exemplary" is intended to refer to an example or illustration. As used herein, the terms "use," "using," and "used" may be considered synonymous with the terms "utilize," "utilizing," and "utilized," respectively.

It will be understood that, although the terms "first," "second," "third," etc., may be used herein to describe various elements, components, regions, layers and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present disclosure.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below.

As used herein, the term "first direction X" denotes one arbitrary direction on a particular plane, the term "second direction Y" denotes a direction on the particular plane that intersects the first direction X, and the term "third direction Z" denotes a direction that is perpendicular to the particular plane. Unless specified otherwise, the term "plane", as used herein, denotes a plane that the first and second directions X and Y both belong to.

In this specification, element A and element B are referred to as being "stacked on each other" not only when element B is disposed on element A but also when element A is disposed on element B.

Exemplary embodiments of the present disclosure will hereinafter be described with reference to the accompanying drawings.

FIG. 1 is an exploded perspective view of a display device according to an exemplary embodiment of the present disclosure.

Referring to FIG. 1, a display device 1 may be a liquid crystal display (LCD) device including a display panel DP, which includes a liquid crystal layer and a light source unit BLU.

The display panel DP may be a panel (e.g., panel-type) member including elements for allowing the display device 1 to display an image. A plurality of pixels (PX1 and PX2), which are arranged substantially in a matrix in a plan view, may be defined on the display panel DP. As used herein, the term "pixel" denotes a single area defined by dividing a display area for the display of colors in a plan view, and a pixel may display a predetermined basic color. That is, a pixel may be a minimum unit area capable of displaying a color independently of other pixels.

The plurality of pixels (PX1 and PX2) may include a first pixel PX1, which displays a first color, and a second pixel PX2, which displays a second color having a shorter peak wavelength than the first color. For example, the first color displayed by the first pixel PX1 may be a red color having a peak wavelength of about 610 nm to about 650 nm, and the second color displayed by the second pixel PX2 may be a blue color having a peak wavelength of about 430 nm to about 470 nm. However, the present disclosure is not limited to this example. In another example, the first color may be a green color having a peak wavelength of about 530 nm to about 570 nm.

The light source unit BLU may be disposed to overlap with the display panel DP in a third direction Z and may emit light having a predetermined wavelength toward the display panel DP. In one exemplary embodiment, the light source unit BLU may be a light source unit (e.g., an edge-type light source unit) including light sources, which directly emit light, and a light guide plate, which guides light provided by the light sources to be emitted toward the display panel DP.

The light sources may be light-emitting diodes (LEDs), organic LEDs (OLEDs), or laser diodes (LDs). In one exemplary embodiment, the light sources may emit blue-wavelength light having a single peak wavelength of about 430 nm to about 470 nm, and the light source unit BLU may provide the blue-wavelength light to the display panel DP. In another exemplary embodiment, the light source unit BLU may emit ultraviolet (UV) light or white light.

The light guide plate may guide light provided by the light sources to travel toward the display panel DP. The material of the light guide plate is not particularly limited as long as it has a high light transmittance. For example, the light guide plate may include a glass material, a quartz material, or a polymer material (such as polyethylene terephthalate (PET), polymethyl methacrylate (PMMA), or polycarbonate (PC)). In another example, the light guide plate may not be provided, and the light source unit BLU may be a direct (e.g., direct-type) light source unit including light sources that are disposed to overlap with the display panel DP in the third direction Z.

Although not specifically illustrated, one or more optical sheets may be further provided between the display panel DP and the light source unit BLU. The optical sheets may include at least one of a prism sheet, a diffusion sheet, a (reflective) polarizing sheet, a lenticular lens sheet, and a micro-lens sheet. The optical sheets may improve the display quality of the display device 1 by modulating the optical characteristics (for example, condensation, diffusion, scattering, or polarization characteristics) of light provided by the light source unit BLU to travel toward the display panel DP.

The display panel DP of the display device 1 will hereinafter be described in more detail with reference to FIG. 2. FIG. 2 is a cross-sectional view of arbitrary pixels of the display device of FIG. 1, particularly, a first pixel PX1 and a second pixel PX2.

Referring to FIGS. 1 and 2, the display panel DP may be, but is not limited to, an LCD panel including an upper substrate 11, a lower substrate 21, and a liquid crystal layer 31, which is interposed between the upper substrate 11 and the lower substrate 21. The liquid crystal layer 31 may be in a state of being sealed by the upper substrate 11, the lower substrate 21, and a sealing member, which bonds the upper substrate 11 and the lower substrate 21. However, the present invention is not limited thereto and various display panels other than an LCD panel may also be applicable to the display panel DP.

The upper substrate 11 will hereinafter be described. The upper substrate 11 may include an upper base substrate 110 and a color conversion pattern 410, and may further include one or more low refractive layers (310 and 320). The upper substrate 11 may be a color conversion substrate or element including the color conversion pattern 410.

The upper base substrate 110 may be a transparent insulating substrate or film. For example, the upper base substrate 110 may include a glass material, a quartz material, or a transparent plastic material. In some exemplary embodiments, the upper base substrate 110 may have flexibility, and the display device 1 may be a curved LCD device.

Light-blocking patterns 205 may be disposed on the rear surface (for example, in the case of FIG. 2, the bottom surface) of the upper base substrate 110. The light-blocking patterns 205 may be disposed along the boundaries between the plurality of pixels (PX1 and PX2) in the display area and may prevent or reduce the occurrence of color mixing defects between the plurality of pixels (PX1 and PX2). For example, the light-blocking patterns 205 may have a substantially lattice shape having a plurality of openings corresponding to the plurality of pixels (PX1 and PX2), respectively, but the present disclosure is not limited thereto. The light-blocking patterns 205 may include a light-blocking colorant (such as an organic material containing a black pigment or dye) or may include an opaque metal material (such as chromium (Cr)).

In some exemplary embodiments, a capping layer 210 may be disposed on the light-blocking patterns 205. The capping layer 210 may be a single layer including an inorganic material. In one exemplary embodiment, the capping layer 210 may include an inorganic material having a refractive index of about 1.7 or lower. Examples of the inorganic material include silicon nitride, but the present disclosure is not limited thereto. The capping layer 210 may prevent or substantially prevent the light-blocking patterns 205 from being damaged or corroded, and may improve the adhesiveness of a first low refractive layer 310.

The first low refractive layer 310 may be disposed on the capping layer 210. The first low refractive layer 310 may have a lower refractive index than the color conversion pattern 410 and a first wavelength band filter 510. The first low refractive layer 310 may be placed in contact with the color conversion pattern 410 and the first wavelength band filter 510. The first low refractive layer 310 may be disposed across the first and second pixels PX1 and PX2. The first low refractive layer 310 may have a different thickness from one area to another area.

In one exemplary embodiment, the first low refractive layer 310 may include a first base resin and particle clusters, which are dispersed in the first base resin. In the exemplary embodiment where the first low refractive layer 310 is a single layer containing the particle clusters, the average refractive index of the first low refractive layer 310 may be lower than the refractive indexes of the color conversion pattern 410 and the first wavelength band filter 510. The material and the functions of the first low refractive layer 310 will be described later in more detail with reference to FIG. 3.

The color conversion pattern 410 may be disposed on the first low refractive layer 310. In some exemplary embodiments, the color conversion pattern 410 may be placed in contact with the first low refractive layer 310. The color conversion pattern 410 may convert the color of incident light into a different color. That is, incident light may be converted into light having a predetermined wavelength band by being transmitted through the color conversion pattern 410. In one exemplary embodiment, the color conversion pattern 410 may be disposed in the first pixel PX1, but not in the second pixel PX2.

The color conversion pattern 410 may include a second base resin 411 and wavelength shifters 412, which are dispersed in the second base resin 411, and may further include first scatterers 413, which are also dispersed in the second base resin 411.

The material of the second base resin 411 is not particularly limited as long as it has a high light transmittance and excellent scattering (e.g., dispersing) properties for the wavelength shifters 412 and the first scatterers 413. For example, the second base resin 411 may include an organic material such as an epoxy resin, an acrylic resin, a cardo resin, or an imide resin.

The wavelength shifters 412 may convert or shift the peak wavelength of incident light. Examples of the wavelength shifters 412 include quantum dots, quantum rods, and phosphors. The quantum dots are a particulate material that emits light of a particular color in response to the transition of the electrons thereof from a conduction band to a valence band.

The quantum dots may be a semiconductor nano-crystal material. The quantum dots, which have a predetermined band gap depending on the composition and the size thereof, may absorb light and may emit light having a predetermined wavelength. Examples of the semiconductor nanocrystals of the quantum dots include Group IV-based nanocrystals, Group II-VI-based compound nanocrystals, Group III-V-based compound nanocrystals, Group IV-VI-based nanocrystals, or a combination thereof.

For example, the Group IV-based nanocrystals may include silicon (Si), germanium (Ge), or a binary compound such as silicon carbide (SiC) or SiGe, but the present disclosure is not limited thereto.

The Group II-VI-based compound nanocrystals may include a binary compound such as CdSe, CdTe, ZnS, ZnSe, ZnTe, ZnO, HgS, HgSe, HgTe, MgSe, MgS, or a mixture thereof; a ternary compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a mixture thereof; or a quaternary compound such as HgZnTeS, CdZnSeS, CdZnSeTe, CdZnSTe, CdHgSeS, CdHgSeTe, CdHgSTe, HgZnSeS, HgZnSeTe, HgZnSTe, or a mixture thereof, but the present disclosure is not limited thereto.

The Group III-V-based compound nanocrystals may include a binary compound such as GaN, GaP, GaAs, GaSb, AlN, AlP, AlAs, AlSb, InN, InP, InAs, InSb, or a mixture thereof, a ternary compound such as GaNP, GaNAs, GaNSb, GaPAs, GaPSb, AlNP, AlNAs, AlNSb, AlPAs, AlPSb, InNP, InNAs, InNSb, InPAs, InPSb, GaAlNP, or a mixture thereof, or a quaternary compound such as GaAlNAs, GaAlNSb, GaAlPAs, GaAlPSb, GaInNP, GaInNAs, GaInNSb, GaIn-PAs, GaInPSb, InAlNP, InAlNAs, InAlNSb, InAlPAs, InAlPSb, or a mixture thereof, but the present disclosure is not limited thereto.

The Group IV-VI-based nanocrystals may include a binary compound such as SnS, SnSe, SnTe, PbS, PbSe, PbTe, or a mixture thereof; a ternary compound such as SnSeS, SnSeTe, SnSTe, PbSeS, PbSeTe, PbSTe, SnPbS, SnPbSe, SnPbTe, or a mixture thereof; or a quaternary compound such as SnPbSSe, SnPbSeTe, SnPbSTe, or a mixture thereof, but the present disclosure is not limited thereto.

In some exemplary embodiments, the quantum dots may have a core-shell structure, and the core-shell structure includes a core including the above-mentioned nanocrystals and a shell surrounding the core. The shell may serve as a protective layer for preventing or reducing the chemical deformation of the core so as to maintain semiconductor characteristics and/or may serve as a charging layer for imparting electrophoretic characteristics to the quantum dots. The shell may have a single- or multilayer structure. Examples of the shell include a metal or non-metal oxide, a semiconductor compound, and a combination thereof.

For example, the metal or non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO; or a ternary compound such as $MgAl_2O_4$, $CoFe_2O_4$, $NiFe_2O_4$, or $CoMn_2O_4$, but the present disclosure is not limited thereto.

For example, the semiconductor compound may be CdS, CdSe, CdTe, ZnS, ZnSe, ZnTe, GaAs, GaP, GaSb, HgS, HgSe, HgTe, InAs, InP, InSb, AlAs, AlP, or AlSb, but the present disclosure is not limited thereto.

Light emitted by the wavelength shifters 412 may have an emission wavelength spectrum half width of about 45 nm or less, about 40 nm or less, or about 30 nm or less, and thus, the purity and reproducibility of colors displayed by the display device 1 can be further improved. Also, the wavelength shifters 412 may emit light in various directions regardless of the incidence direction of incident light. As a result, the side visibility of the first color displayed by the first pixel PX1 of the display device 1 can be improved.

In a non-limiting example, the wavelength shifters 412 of the color conversion pattern 410, which is disposed in the first pixel PX1, may absorb at least some blue light provided by the light source unit BLU and may emit red-wavelength light having a single peak wavelength of about 610 nm to about 650 nm. Accordingly, light transmitted through the color conversion pattern 410 may turn red, and the first pixel PX1 may display a red color.

The first scatterers 413 may have a different refractive index from the second base resin 411 and may form an optical interface with the second base resin 411. For example, the first scatterers 413 may be light-scattering particles. The material of the first scatterers 413 is not particularly limited as long as it is capable of scattering at least some light transmitted through the color conversion pattern 410. For example, the first scatterers 413 may be particles of a metal oxide or of an organic material. The metal oxide may be titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$), and the organic material may be an acrylic resin or a urethane resin. The first scatterers 413 may scatter light in various directions, regardless of the incidence angle of incident light, without substantially changing the wavelength of light transmitted through the color conversion pattern 410. The length of the path of light transmitted through the color conversion pattern 410 can be increased, and the color conversion efficiency of the wavelength shifters 412 can be improved.

In some exemplary embodiments, the first wavelength band filter 510 may be disposed between the capping layer 210 and the first low refractive layer 310. The first wavelength band filter 510 may be placed in contact with the capping layer 210 and the first low refractive layer 310. The first wavelength band filter 510 may be a wavelength-selective optical filter selectively transmitting only some light therethrough by blocking the transmission of light of a particular wavelength band. The first wavelength band filter 510 may be disposed in the first pixel PX1, but not in the second pixel PX2.

In one exemplary embodiment, the first wavelength band filter 510 may be a color filter including a base resin and an organic material that contains a colorant (such as a pigment or dye) dispersed or dissolved in the base resin. For example, the first wavelength band filter 510 may selectively absorb blue-wavelength light having a peak wavelength of about 430 nm to about 470 nm and may selectively transmit light of other wavelength bands therethrough. By providing the first wavelength band filter 510, which blocks the transmission of blue-wavelength light, between the color conversion pattern 410 and a viewer, the spectrum of red colors displayed by the first pixel PX1 can be further sharpened, and the color purity and the display quality of the display device 1 can be improved.

A scattering pattern 420 may also be disposed on the first low refractive layer 310. The scattering pattern 420 may scatter at least some light transmitted therethrough. In one exemplary embodiment, the scattering pattern 420 may be disposed in the second pixel PX2, but not in the first pixel PX1.

The scattering pattern 420 may include a third base resin 421 and second scatterers 423, which are dispersed in the third base resin 421, and may further include a colorant, which is dispersed or dissolved in the third base resin 421.

The material of the third base resin 421, like the material of the second base resin 411, is not particularly limited as long as it has a high light transmittance and excellent scattering properties for the second scatterers 423. For example, the third base resin 421 may include an organic material such as an epoxy resin, an acrylic resin, a cardo resin, or an imide resin. The material of the second scatterers 423 is not particularly limited as long as it is capable of scattering at least some light transmitted through the color conversion pattern 410. For example, the second scatterers 423 may be particles of a metal oxide or particles of an organic material. The second scatterers 423 may scatter light in various directions regardless of the incidence angle of incident light, without substantially changing the wavelength of light transmitted through the scattering pattern 420. Accordingly, the side visibility of the second color displayed by the second pixel PX2 of the display device 1 can be improved.

In some exemplary embodiments, the scattering pattern 420 may further include a colorant (such as a pigment or dye), which is dispersed or dissolved in the third base resin 421. For example, the scattering pattern 420 may selectively transmit blue-wavelength light having a peak wavelength of about 430 nm to about 470 nm therethrough. Accordingly, the spectrum of blue colors displayed by the second pixel PX2 can be further sharpened, and the color purity and the display quality of the display device 1 can be improved.

In a non-limiting example, the scattering pattern 420, which is disposed in the second pixel PX2, may transmit blue light provided by the light source unit BLU therethrough, and the second pixel PX2 may display a blue color.

The second low refractive layer 320 may be disposed on the color conversion pattern 410 and the scattering pattern 420. The second low refractive layer 320 may have a lower refractive index than the color conversion pattern 410 and the first wavelength band filter 510. The second low refractive layer 320 may include the same material as, or a different material from, the first low refractive layer 310. The second low refractive layer 320 may be placed in contact with the color conversion pattern 410 and may cover the side surface of the color conversion pattern 410. The second low refractive layer 320 may be disposed across the first and second pixels PX1 and PX2. The second low refractive layer 320 may be placed in at least partial contact with the first low refractive layer 310.

The second low refractive layer 320 may include a fourth base resin and particle clusters, which are dispersed in the fourth base resin. In an exemplary embodiment where the second low refractive layer 320 is a single layer containing the particle clusters, the average refractive index of the second low refractive layer 320 may be lower than the refractive indexes of the color conversion pattern 410 and the first wavelength band filter 510.

In some exemplary embodiments, the second low refractive layer 320 may minimize or reduce height differences between multiple elements stacked on the upper base substrate 110. That is, the second low refractive layer 320 may perform a primary planarization function. The material and the functions of the second low refractive layer 320 will be described later in more detail with reference to FIG. 3.

An overcoat layer 610 may be disposed on the second low refractive layer 320. The overcoat layer 610 may be disposed across the first and second pixels PX1 and PX2. The overcoat layer 610 may minimize or reduce height differences between multiple elements stacked on the upper base substrate 110. That is, the overcoat layer 610 may perform a secondary planarization function. In some exemplary embodiments, the overcoat layer 610 may be disposed directly on the second low refractive layer 320. The material of the overcoat layer 610 is not particularly limited as long as it has excellent planarization characteristics and a high light transmittance. For example, the overcoat layer 610 may be an organic layer including an organic material such as an epoxy resin, an acrylic resin, a cardo resin, a siloxane resin, or a silsesquioxane resin.

In some exemplary embodiments, a first passivation layer 220 may be disposed on the overcoat layer 610. The first passivation layer 220 may include a non-metal inorganic material. Examples of the non-metal inorganic material include silicon oxide, silicon nitride, or silicon oxynitride. The first passivation layer 220 may protect the overcoat layer 610 in the process of forming linear patterns 650 that will be described later, but the present disclosure is not limited thereto. In a case where the linear patterns 650 are formed by dry etching, the first passivation layer 220 may perform an etch stopper function and may thus prevent or substantially prevent the overcoat layer 610 from being etched unintentionally. Also, the first passivation layer 220 may improve the adhesiveness of the linear patterns 650 to the overcoat layer 610, which include an organic material, and may improve the durability and reliability of the display device 1 by preventing or substantially preventing the linear patterns 650 from being damaged or corroded by impurities such as air or moisture. In another exemplary embodiment, the first passivation layer 220 may not be provided, and the linear patterns 650 may be disposed directly on the overcoat layer 610.

The linear patterns 650 may be disposed on the first passivation layer 220. Although not specifically illustrated, the linear patterns 650, which extend in one direction, may be disposed to be spaced apart from one another and may form a linear grating. The linear patterns 650 may perform the functions of a polarizing element such as, for example, an upper polarizing element, together with the liquid crystal layer 31. In one exemplary embodiment, the linear patterns 650 may have the characteristics of a reflective polarizer, blocking the transmission of polarization components vibrating in a direction substantially parallel to the direction in which the linear patterns 650 extend and allowing the transmission of polarization components vibrating in a direction substantially parallel to the direction in which the linear patterns 650 are spaced apart from one another. That is, the linear patterns 650 may reflect at least some incident light and may impart polarization characteristics to light transmitted therethrough.

The material of the linear patterns 650 is not particularly limited as long as it is easy to be processed and has an excellent reflectivity. For example, the linear patterns 650 may include a metal material. Examples of the metal material include aluminum (Al), silver (Ag), gold (Au), copper (Cu), titanium (Ti), molybdenum (Mo), nickel (Ni), and an alloy thereof. In some exemplary embodiments, the linear patterns 650 may have a stack of the metal material and a non-metal inorganic material (e.g., the metal material and a non-metal inorganic material stacked over each other).

A second passivation layer 230 may be disposed on the linear patterns 650. The second passivation layer 230 may be disposed directly on the linear patterns 650. Thus, the second passivation layer 230 may cover and protect the linear patterns 650 and may insulate the linear patterns 650 from a common electrode 690 that will be described later. Also, the second passivation layer 230 may define gaps AG between the linear patterns 650. The gaps AG may be filled with a gas or may be empty. The second passivation layer 230 may include an organic material or an inorganic material, or may have a stack of the organic material and the inorganic material. Examples of the organic material include an epoxy resin, an acrylic resin, a cardo resin, a siloxane resin, and a silsesquioxane resin, and examples of the inorganic material include silicon nitride, silicon oxide, and silicon oxynitride.

The common electrode 690 may be disposed on the second passivation layer 230. The common electrode 690 may be a field-generating electrode that forms an electric field in the liquid crystal layer 31 together with pixel electrodes 670. The electric field formed by the common electrode 690 and the pixel electrodes 670 may control the behavior of liquid crystals 35 and may realign the liquid crystals 35. The common electrode 690 may be disposed across the first and second pixels PX1 and PX2 without regard to the distinction between the plurality of pixels (PX1 and PX2), and a common voltage may be applied to the common electrode 690. The common electrode 690 may include a transparent conductive material. Examples of the transparent conductive material include indium tin oxide (ITO), indium zinc oxide (IZO), zinc oxide (ZnO), indium (III) oxide ($In_2O_3$), indium gallium oxide (IGO), and aluminum-doped zinc oxide (AZO).

The lower substrate 21 will hereinafter be described. The lower substrate 21 may include a lower base substrate 120, switching elements TR, and pixel electrodes 670.

The lower base substrate 120, like the upper base substrate 110, may be a transparent insulating substrate or film. For example, the lower base substrate 120 may include a glass material, a quartz material, or a transparent plastic material. In some exemplary embodiments, the lower base substrate 120 may have flexibility, and the display device 1 may be a curved LCD device.

The switching elements TR may be disposed on the front surface (for example, in the case of FIG. 2, the top surface) of the lower base substrate 120. The switching elements TR may be disposed in the plurality of pixels (PX1 and PX2) and may allow or block the transmission of driving signals to the pixel electrodes 670. In one exemplary embodiment, the switching elements TR may be thin-film transistors (TFTs). The control terminals of the TFTs TR may be connected to gate lines GL and may receive a gate driving signal, the input terminals of the TFTs TR may be connected to data lines DL and may receive a data driving signal, and the output terminals of the TFTs TR may be electrically connected to the pixel electrodes 670.

A middle layer 620 may be disposed on the switching elements TR. The middle layer 620 may insulate elements formed thereon from elements formed therebelow and may minimize or reduce height differences between multiple elements stacked on the lower base substrate 120. That is, the middle layer 620 may perform both an insulation function and a planarization function. The middle layer 620 may include one or more layers. For example, the middle layer 620 may include an organic layer including an organic material, an inorganic layer including an inorganic material, or a stack of the organic layer and the inorganic layer.

The pixel electrodes 670 may be disposed on the middle layer 620. The pixel electrodes 670 may be field-generating electrodes that form an electric field in the liquid crystal layer 31 together with the common electrode 590. The pixel electrodes 670 may be disposed in the plurality of pixels (PX1 and PX2). The pixel electrodes 670 may be independently controllable and may be provided with different driving signals. For example, the pixel electrodes 670 may be electrically connected to the output terminals of the switching elements TR via contact holes, which are formed in the middle layer 620. The pixel electrodes 670, like the common electrode 690, may include a transparent conductive material.

The liquid crystal layer 31 will hereinafter be described. The liquid crystal layer 31 may be disposed between the upper substrate 11 and the lower substrate 21. The liquid crystal layer 31 may include a plurality of liquid crystals, which are initially aligned. As used herein, the term "liquid crystal" denotes a single molecule having liquid crystal characteristics or a group of such molecules. In one exemplary embodiment, the liquid crystals 35 may have negative dielectric anisotropy and may be initially aligned such that their long axes are substantially perpendicular to a plane. For example, the liquid crystals 35 may be substantially vertically aligned to have a predetermined pretilt.

Figure 3:
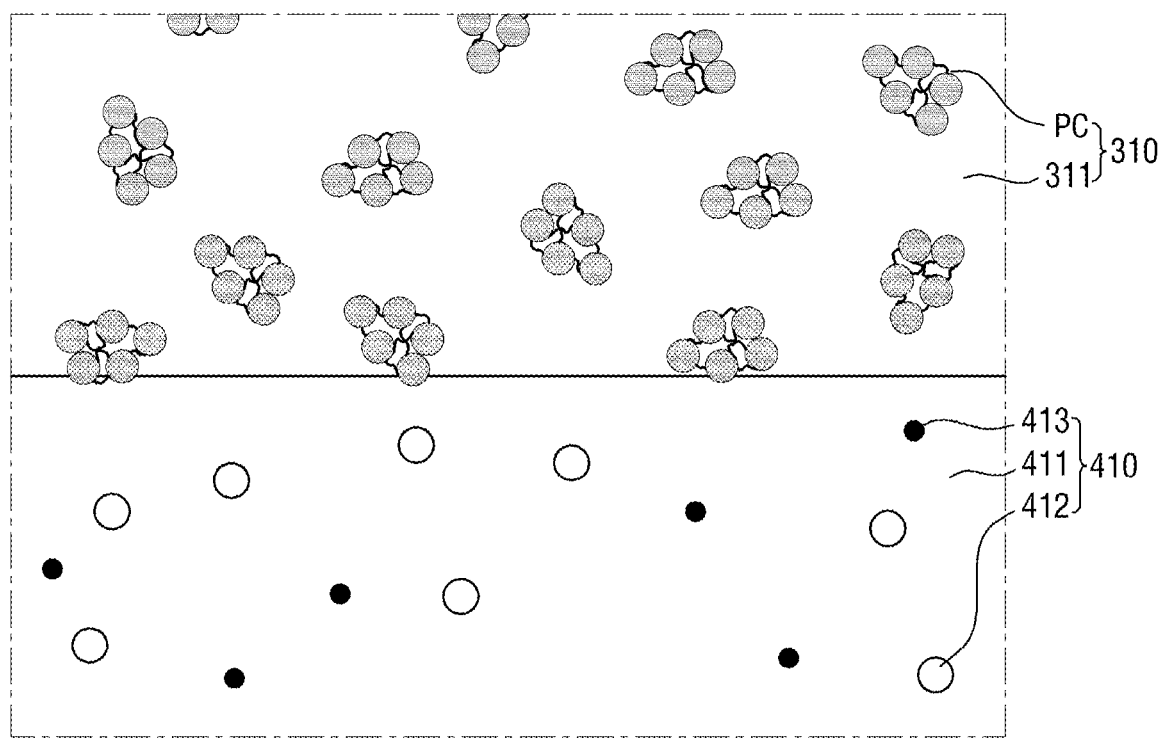
FIG. 3 is an enlarged view of an area A of FIG. 2.
Figure 4:
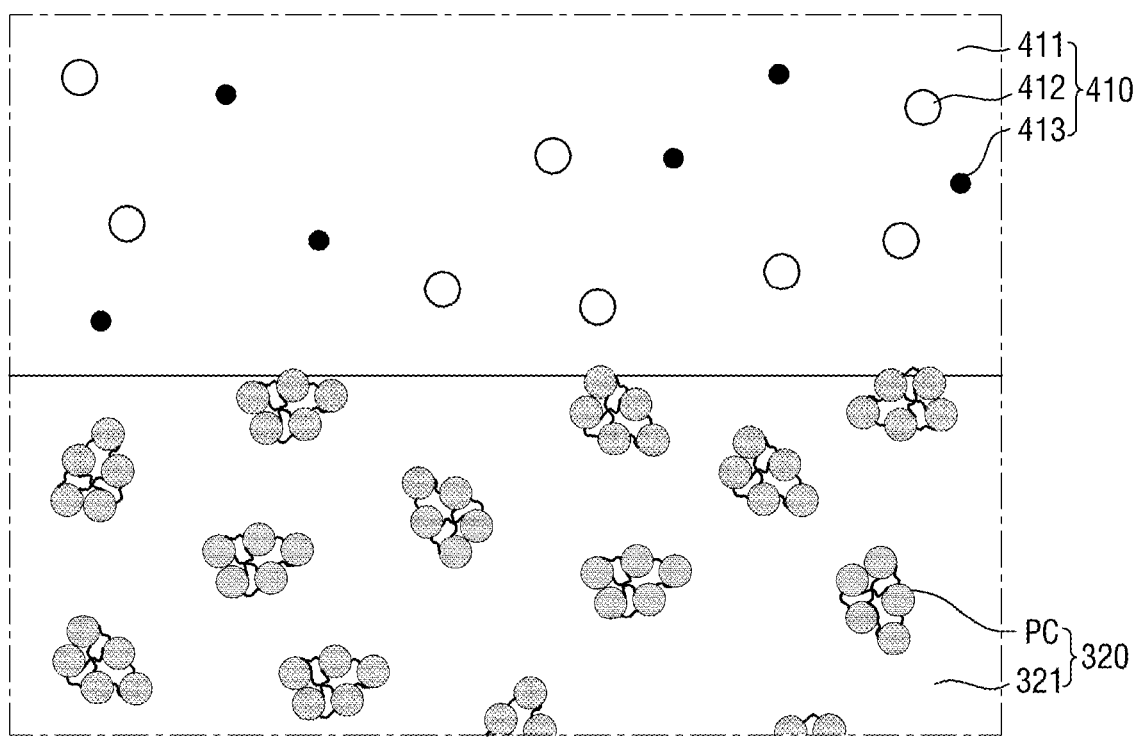
FIG. 4 is an enlarged view of an area B of FIG. 2.
Figure 5:
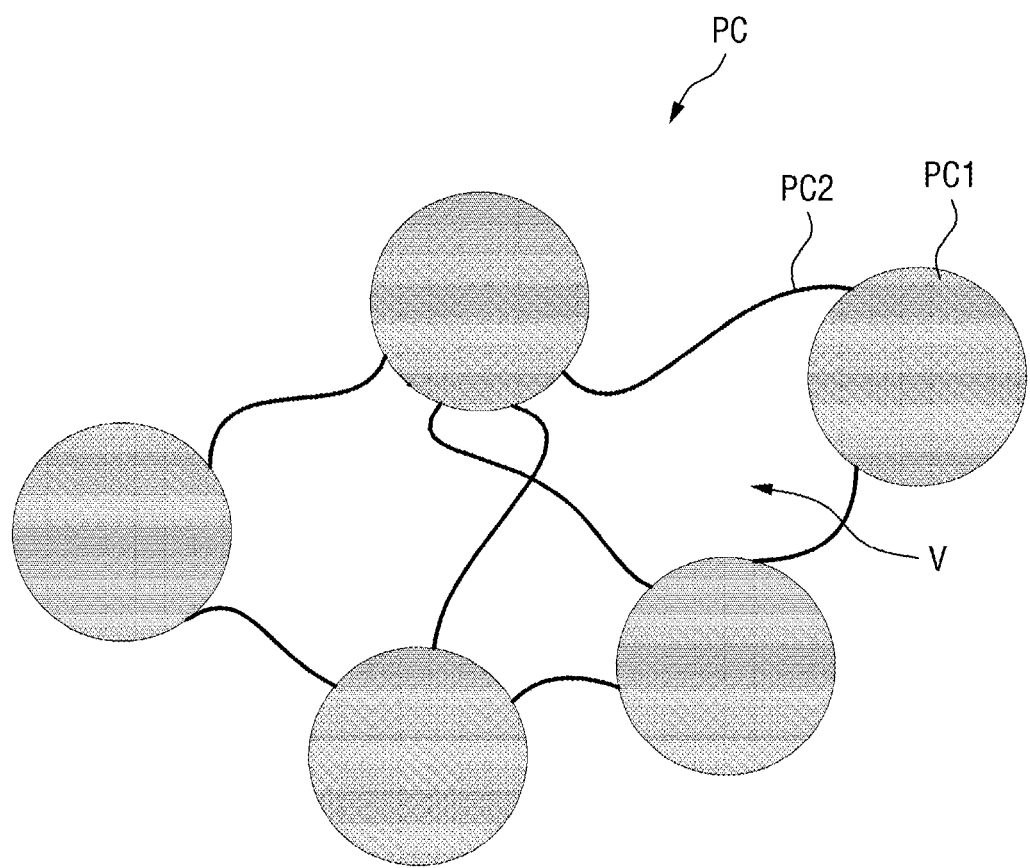
FIG. 5 is a schematic view illustrating a particle cluster of FIGS. 2 and 3.
Figure 6:
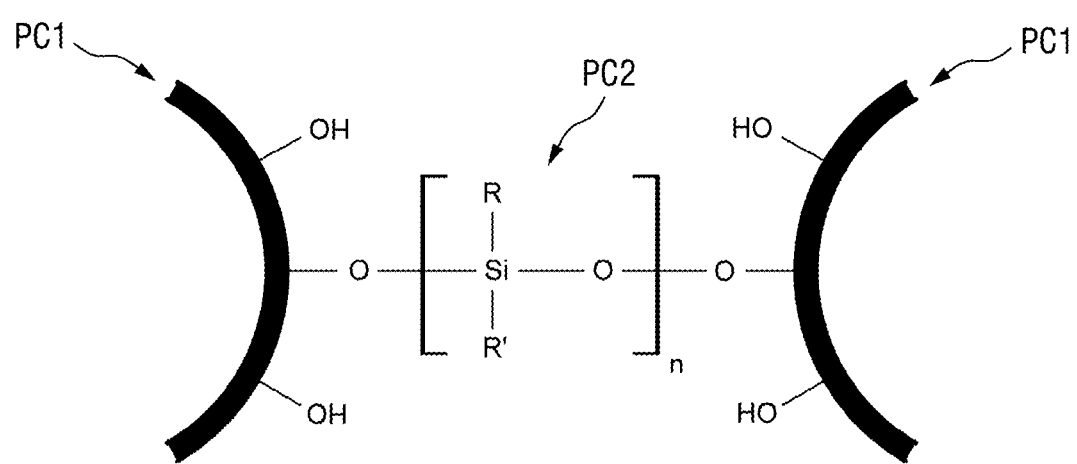
FIG. 6 is a schematic view illustrating a chemical bond of a bridge between silicon particles.

The first and second low refractive layers 310 and 320 of the display device 1 will hereinafter be described in more detail with reference to FIGS. 3 through 6. FIG. 3 is an enlarged view of an area A of FIG. 2. Specifically, FIG. 3 is a cross-sectional view illustrating an optical interface between the first low refractive layer 310 and the color conversion pattern 410. FIG. 4 is an enlarged view of an area B of FIG. 2. Specifically, FIG. 4 is a cross-sectional view illustrating an optical interface between the color conversion pattern 410 and the second low refractive layer 320. FIG. 5 is a schematic view illustrating the particle clusters of FIGS. 2 and 3. FIG. 6 is a schematic view illustrating a chemical bond of a bridge between silicon particles.

Referring to FIGS. 1 through 6, the first low refractive layer 310 may include a first base resin 311 and particle clusters PC, which are dispersed in the first base resin 311, and the second low refractive layer 320 may include a fourth base resin 321 and particle clusters PC, which are dispersed in the fourth base resin 321. FIGS. 3 and 4 illustrate the particle clusters PC as being spaced apart from one another in the first or second low refractive layer 310 or 320, but alternatively, the particle clusters PC may be in close proximity to one another. That is, the dispersion density of the particle clusters PC may be higher than that shown in FIG. 3 or FIG. 4.

The first low refractive layer 310 will hereinafter be described in more detail. In one exemplary embodiment, the first low refractive layer 310 may form an optical interface by being placed in contact with the color conversion pattern 410. A surface of the first low refractive layer 310 that the color conversion pattern 410 is placed in contact with may be uneven. The uneven surface of the first low refractive layer 310 may be due to the presence of the particle clusters PC in the first low refractive layer 310. For example, the particle clusters PC may protrude, or may be recessed, to form the surface of the first low refractive layer 310.

The refractive index of the first low refractive layer 310 may be lower than the refractive index of the color conversion pattern 410. For example, the refractive index of the first low refractive layer 310 may be lower than the refractive index of the second base resin 411. For example, the refractive index of the second base resin 411 may be at least 0.3 higher than the refractive index of the first low refractive layer 310. By increasing the difference between the refractive index of the first low refractive layer 310 and the refractive index of the color conversion pattern 410, the total reflection of light at the interface between the first low refractive layer 310 and the color conversion pattern 410 can be facilitated. That is, the amount of light reflected from the interface between the first low refractive layer 310 and the color conversion pattern 410, from among beams of light travelling from the color conversion pattern 410 to the first low refractive layer 310, can be increased, and the utilization efficiency of light can be improved.

In some exemplary embodiments, the refractive index of the first low refractive layer 310 may be lower than the refractive index of the first wavelength band filter 510. For example, the refractive index of the first wavelength band filter 510 may be at least 0.3 higher than the refractive index of the first low refractive layer 310. Accordingly, an effective optical interface can be formed between the first wavelength band filter 510 and the first low refractive layer 310.

Similarly, the second low refractive layer 320 may form an optical interface by being placed in contact with the color conversion pattern 410. A surface of the second low refractive layer 320 that the color conversion pattern 410 is placed in contact with may be uneven. The uneven surface of the second low refractive layer 320 may be due to the presence of the particle clusters PC in the second low refractive layer 320.

The refractive index of the second low refractive layer 320 may be lower than the refractive index of the color conversion pattern 410. For example, the refractive index of the second low refractive layer 320 may be lower than the refractive index of the second base resin 411. For example, the refractive index of the second base resin 411 may be at least 0.3 higher than the refractive index of the second low refractive layer 320. By increasing the difference between the refractive index of the second low refractive layer 320 and the refractive index of the color conversion pattern 410, the total reflection of light at the interface between the second low refractive layer 320 and the color conversion pattern 410 can be facilitated. That is, the amount of light reflected from the interface between the second low refractive layer 320 and the color conversion pattern 410, from among beams of light travelling from the color conversion pattern 410 to the second low refractive layer 320, can be increased, and the utilization efficiency of light can be improved.

In some exemplary embodiments, the refractive index of the second low refractive layer 320 may be lower than the refractive index of the first wavelength band filter 510. For example, the refractive index of the first wavelength band filter 510 may be at least 0.3 higher than the refractive index of the second low refractive layer 320, but the present disclosure is not limited thereto.

The particle clusters PC may include particles PC1 and bridges PC2, which combine the particles PC1 to one another.

In one exemplary embodiment, the particles PC1 may be silica particles. For example, the particles PC1 may be hollow silica particles or non-hollow silica particles. The particle size of the hollow silica particles may be, for example, about 50 nm to about 100 nm. The particle size of the non-hollow silica particles may be, for example, about 10 nm to about 30 nm.

Pores or voids V may be defined between the particles PC1. In some exemplary embodiments where the particles PC1 are silica particles, the volume of the voids V can be increased by using relatively fine particles, and as a result, the refractive index of the first and second low refractive layers 310 and 320 can be reduced. In one exemplary embodiment, the refractive index of the first and second low refractive layers 310 and 320 may be about 1.1 to about 1.4 or about 1.15 to about 1.3.

The bridges PC2 may be bonded to functional groups on the surfaces of the particles PC1 to couple the particles PC1 to one another and to form the voids V. In one exemplary embodiment, the bridges PC2 may include polysiloxane bonds. The bridges PC2, which are formed between the particles PC1, may be expressed (e.g., illustrated) as shown in FIG. 6. In some exemplary embodiments where the particles PC1 are silica particles, the bridges PC2 may be formed through dehydration reactions between hydroxyl groups on the surfaces of the silica particles and a polysiloxane polymer, but the present disclosure is not limited thereto. Referring to FIG. 6, R and R' are each independently selected from the group consisting of hydrogen, fluorine, a hydroxyl group, an alkyl group having 1 to 12 carbon atoms, an alkoxy group having 1 to 12 carbon atoms, a fluorinated alkyl group having 1 to 12 carbon atoms, a vinyl group, and a (meth)acrylate group.

The first base resin 311 of the first low refractive layer 310 and the fourth base resin 321 of the second low refractive layer 320 may each include a siloxane-based polymer. The siloxane-based polymer may be represented by Formula 1 below, but the present disclosure is not limited thereto.

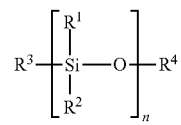

Formula 1

Referring to Formula 1, $R^1$, $R^2$, $R^3$, and $R^4$ are each independently selected from the group consisting of hydrogen, fluorine, a hydroxyl group, an alkyl group having 1 to 12 carbon atoms, an alkoxy group having 1 to 12 carbon atoms, a fluorinated alkyl group having 1 to 12 carbon atoms, a vinyl group, and a (meth)acryl group.

The weight-average molecular weight of the siloxane-based polymer may be about 100 g/mol to about 10,000 g/mol. When the weight-average molecular weight of the siloxane-based polymer is about 100 g/mol or greater, the siloxane-based polymer can serve as a matrix for dispersing the particle clusters PC. Also, when the weight-average molecular weight of the siloxane-based polymer is about 10,000 g/mol or less, the siloxane-based polymer can improve the processability and the planarization and adhesion characteristics of the first and second low refractive layers 310 and 320.

In some exemplary embodiments, the siloxane-based polymer, which is contained in the first and fourth base resins 311 and 321, may have a fluorine-substituted side chain. The fluorine-substituted side chain may contain a fluorine atom or a fluoroalkyl group. When the siloxane-based polymer has the fluorine-substituted side chain, the refractive index of the first and fourth base resins 311 and 321, which are formed by the siloxane-based polymer, can be lowered. That is, the refractive index of the first and second low refractive layers 310 and 320 can be further lowered not only by forming the voids V between the particles PC1, but also by lowering the refractive index of the first and fourth base resins 311 and 321.

The bridges PC2 of the particle clusters PC and the siloxane-based polymer of the first and fourth base resins 311 and 321 may have the same repeating unit. For example, the bridges PC2 of the particle clusters PC and the siloxane-based polymer of the first and fourth base resins 311 and 321 are both siloxane-based polymers having a polysiloxane bond. By forming the bridges PC2 of the particle clusters PC and the first and fourth base resins 311 and 321 with the same kind of polymer, the fabrication of the first and second low refractive layers 310 and 320 can be simplified, the dispersion characteristics of the particle clusters PC for the first and fourth base resins 311 and 321 can be improved, and the first and second low refractive layers 310 and 320 can be provided with a uniform refractive index.

In another exemplary embodiment, one of the first and second low refractive layers 310 and 320 may not be provided.

Figure 7:
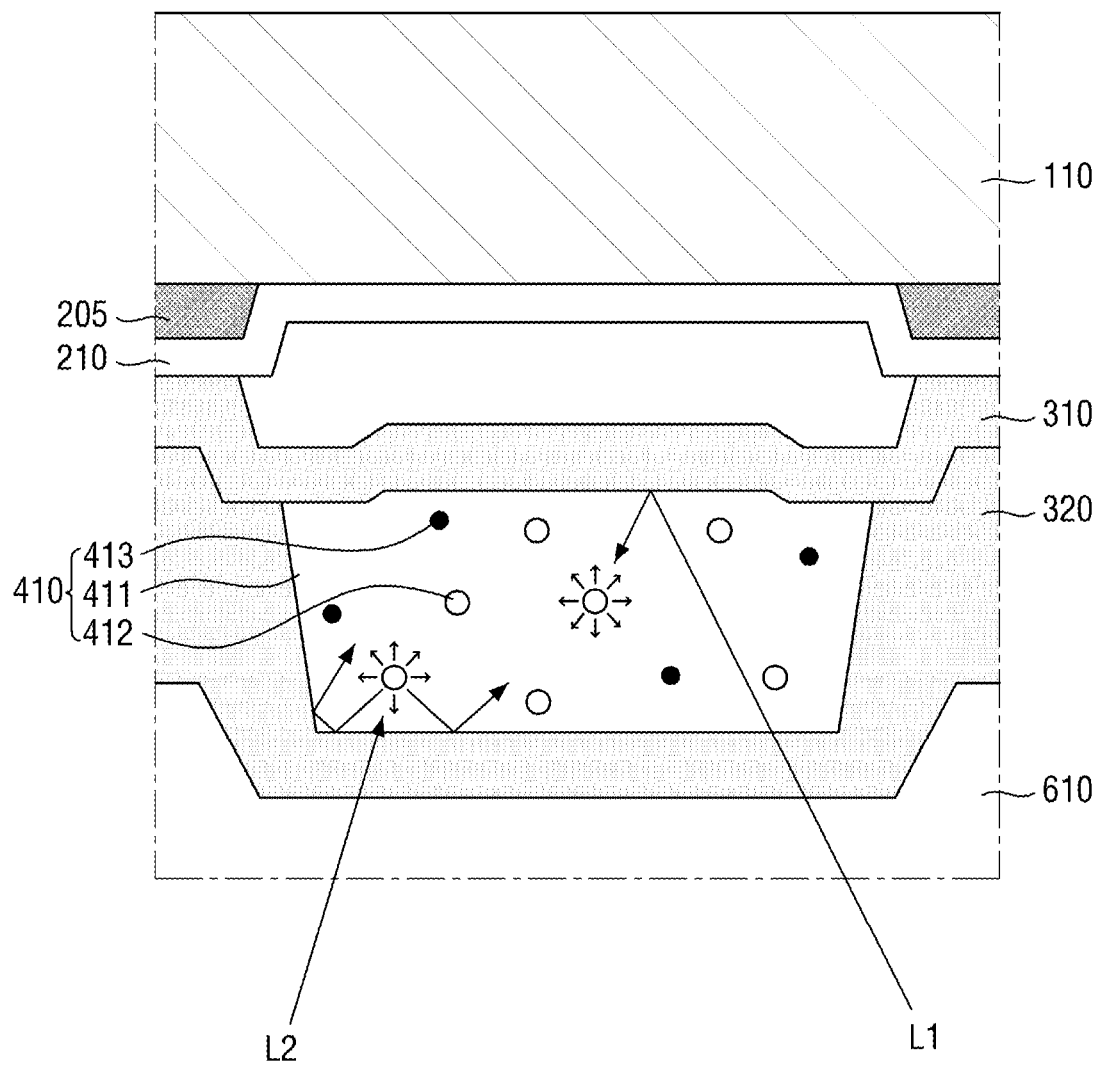
FIG. 7 is a cross-sectional view for explaining the functions of first and second low refractive layers of the display device of FIG. 2.

The functions of the first and second low refractive layers 310 and 320 of the display device 1 will hereinafter be described in more detail with reference to FIG. 7. FIG. 7 is a cross-sectional view for explaining the functions of the first and second low refractive layers of the display device of FIG. 2. Specifically, FIG. 7 is a cross-sectional view illustrating the color conversion pattern 410 of the first pixel PX1 and the first and second low refractive layers 310 and 320.

Referring to FIG. 7, light provided by a light source unit may penetrate the color conversion pattern 410.

In a non-limiting example, at least some blue light provided to the color conversion pattern 410 may not be subjected to color conversion performed by the wavelength shifters 412, and may directly penetrate the second base resin 411 to travel toward the first low refractive layer 310 as blue light L1.

As already mentioned above, when the refractive index of the first low refractive layer 310 and the refractive index of the color conversion pattern 410 differ significantly from each other, the total reflection of light at the optical interface between the first low refractive layer 310 and the color conversion pattern 410 can be facilitated. The first low refractive layer 310 may recycle at least some of the blue light L1 transmitted through the second base resin 411 without contributing to color conversion, and may thus allow the recycled blue light to contribute to color conversion. In this manner, the utilization efficiency of light can be increased, and the display quality (such as luminance) of the display device 1 can be improved.

In another non-limiting example, at least some blue light L2 provided to the color conversion pattern 410 may be converted into red light by the wavelength shifters 412. The wavelength shifters 412 may emit light in various directions regardless of the incidence angle of incident light. That is, at least some red light emitted by the wavelength shifters 412 may travel toward the second low refractive layer 320, rather than toward the viewer (for example, in the case of FIG. 7, in an upward direction), and thus may not be able to contribute to the display of an image.

However, as already mentioned above, when the refractive index of the second low refractive layer 320 and the refractive index of the color conversion pattern 410 differ significantly from each other, the total reflection of light at the optical interface between the second low refractive layer 320 and the color conversion pattern 410 can be facilitated. The second low refractive layer 320 may recycle at least some red light traveling toward the second low refractive layer 320 without contributing to the display of an image, and may thus allow the recycled red light to contribute to the display of an image. In this manner, the utilization efficiency of light can be increased, and the display quality (such as luminance) of the display device 1 can be improved.

The color conversion pattern 410 of the display device 1 may be completely surrounded by the first and second low refractive layers 310 and 320. Accordingly, light transmitted through the color conversion pattern 410 and/or light emitted from the wavelength shifters 412 of the color conversion pattern 410 can be trapped, and as a result, the utilization efficiency of light can be increased.

Display devices according to other exemplary embodiments of the present disclosure will hereinafter be described. In the accompanying drawings, like reference numerals indicate like elements, and thus, detailed descriptions thereof will not be repeated.

Figure 8:
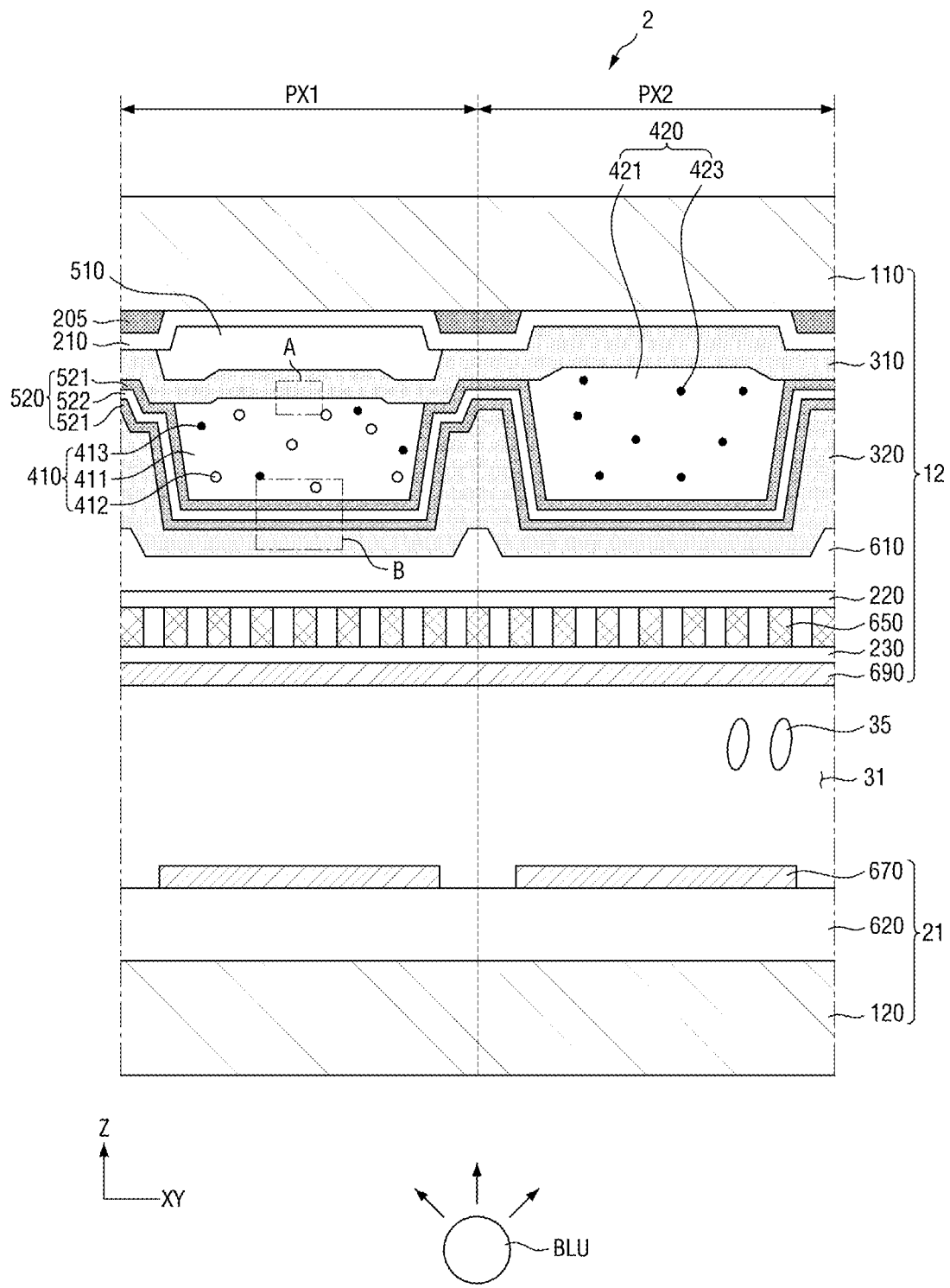
FIG. 8 is a cross-sectional view of a display device according to another exemplary embodiment.
Figure 9:
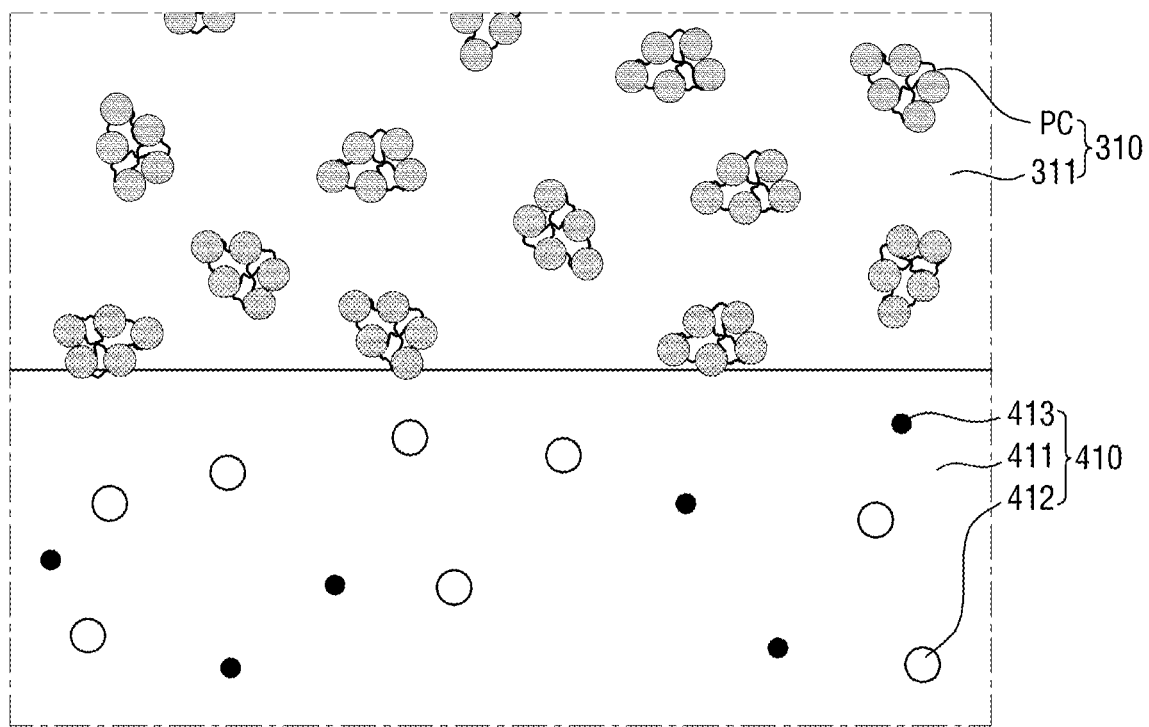
FIG. 9 is an enlarged view of an area A of FIG. 8.
Figure 10:
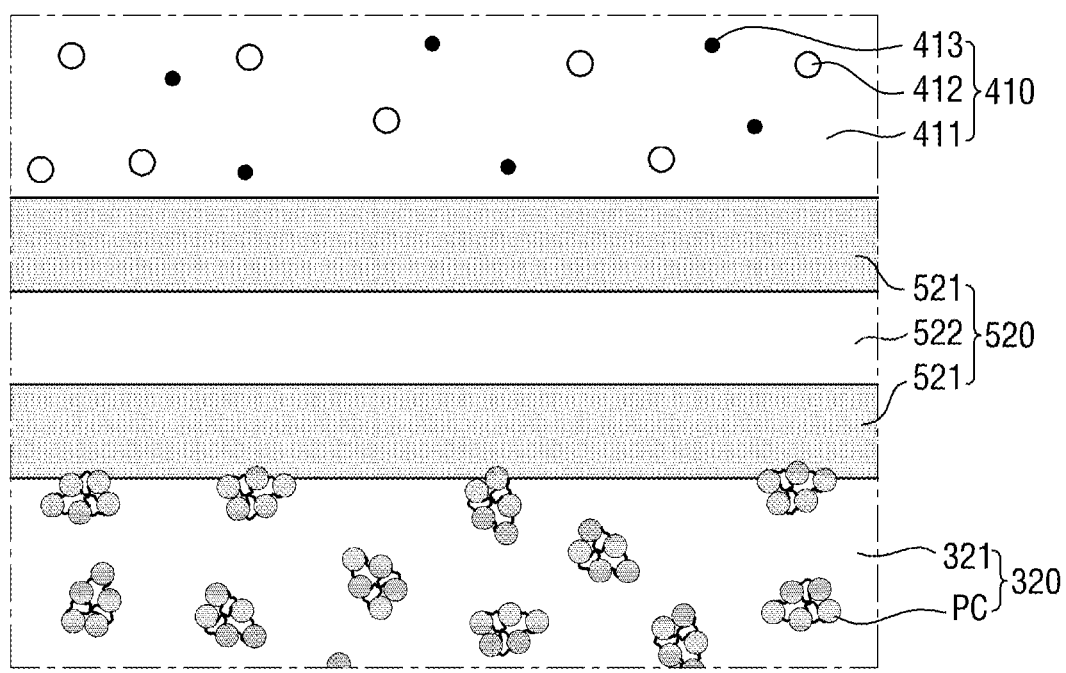
FIG. 10 is an enlarged view of an area B of FIG. 8.

FIG. 8 is a cross-sectional view of a display device according to another exemplary embodiment of the present disclosure. FIG. 9 is an enlarged view of an area A of FIG. 8. Specifically, FIG. 9 is a cross-sectional view illustrating an optical interface between a first low refractive layer 310 and a color conversion pattern 410. FIG. 10 is an enlarged view of an area B of FIG. 8. Specifically, FIG. 10 is a cross-sectional view illustrating optical interfaces that a second wavelength band filter 520 forms with the color conversion pattern 410 and a second low refractive layer 320.

Referring to FIGS. 8 through 10, a display device 2 differs from the display device of FIG. 2 in that an upper substrate 12 further includes a second wavelength band filter 520.

In one exemplary embodiment, the second wavelength band filter 520 may be further disposed between a color conversion pattern 410 and a second low refractive layer 320. The second wavelength band filter 520 may be a wavelength-selective optical filter selectively transmitting only some light therethrough by blocking the transmission of light of a particular wavelength band. The second wavelength band filter 520 may be disposed across first and second pixels PX1 and PX2. The second wavelength band filter 520 may be placed in contact with the color conversion pattern 410 and the second low refractive layer 320 and may cover the side surface of the color conversion pattern 410. The second wavelength band filter 520 may be placed in at least partial contact with a first low refractive layer 310. In this case, the color conversion pattern 410 and the second low refractive layer 320 may not be placed in contact with each other and may be spaced apart from each other.

The second wavelength band filter 520 may include one or more first inorganic layers 521 and one or more second inorganic layers 522. The second wavelength band filter 520 may be a dispersive Bragg reflector including a plurality of layers. For example, the second wavelength band filter 520 may selectively reflect green-wavelength light having a peak wavelength of about 530 nm to about 570 nm and red-wavelength light having a peak wavelength of about 610 nm to about 650 nm, and may selectively transmit other-wavelength light therethrough. The wavelength of light that the second wavelength band filter 520 transmits therethrough and the wavelength of light that the second wavelength band filter 520 reflects may be controlled by the difference between the refractive index of the first inorganic layers 521 and the refractive index of the second inorganic layers 522, the difference between the thickness of the first inorganic layers 521 and the thickness of the second inorganic layers 522, and/or the number of first inorganic layers 521 and the number of second inorganic layers 522.

The first inorganic layers 521 and the second inorganic layers 522 may include different materials. For example, the first inorganic layers 521 may include a material having a refractive index of 1.7 or higher, and the second inorganic layers 522 may include a material having a refractive index of 1.5 or lower. For example, the first inorganic layers 521 may include silicon nitride, and the second inorganic layers 522 may include silicon oxide. However, the present disclosure is not limited to these examples.

In a non-limiting example, the second wavelength band filter 520 may include an odd number of layers. In a case where the first inorganic layers 521 and the second inorganic layers 522 are alternately stacked, the uppermost and lowermost layers of the second wavelength band filter 520 may both include the same material. FIG. 2 illustrates the second wavelength band filter 520 as including three layers with two first inorganic layers 521 and one second inorganic layer 522, but the present disclosure is not limited thereto.

In some exemplary embodiments, the uppermost layer (or the lowermost layer in FIG. 8) of the second wavelength band filter 520 that is placed in contact with the second low refractive layer 320 and the lowermost layer (or the uppermost layer in FIG. 8) of the second wavelength band filter 520 that is placed in contact with the color conversion pattern 410 may both be first inorganic layers 521. By placing the first inorganic layers 521, which have a relatively higher refractive index than the second inorganic layers 522, in contact with the color conversion pattern 410, the reflection efficiency of the second wavelength band filter 520 for green- or red-wavelength light can be improved. Also, by placing the first inorganic layers 521 in contact with the first low refractive layer 310, the adhesiveness of the first low refractive layer 310 to the second wavelength band filter 520 can be improved. Also, by placing the first inorganic layers 521 in contact with the second low refractive layer 320, the difference between the refractive index of the first inorganic layers 521 and the refractive index of the second inorganic layers 522 can be enhanced or maximized, and at the same time, the adhesiveness of the second low refractive layer 320 to the second wavelength band filter 520 can be improved.

The second wavelength band filter 520 may reflect light emitted toward the second wavelength band filter 520 (for example, in the case of FIG. 8, in a downward direction), from among beams of red light emitted in various directions by the wavelength shifters 412 in the first pixel PX1, such that the reflected light travels toward an upper base substrate 110, i.e., toward a viewer, and may thus allow the reflected light to contribute to the display of an image. In this manner, the utilization efficiency of light can be increased, and the display quality (such as luminance and color purity) of the display device 2 can be improved.

The second low refractive layer 320 may form an optical interface by being placed in contact with the second wavelength band filter 520, particularly, the first inorganic layers 521 of the second wavelength band filter 520. A surface of the second low refractive layer 320 that is placed in contact with the first inorganic layers 521 may be uneven. The uneven surface of the second low refractive layer 320 may be due to the presence of particle clusters PC.

The refractive index of the second low refractive layer 320 may be lower than the refractive index of the first inorganic layers 521. For example, the refractive index of the second low refractive layer 320 may be about 1.1 to about 1.4 or about 1.15 to about 1.3, and the refractive index of the first inorganic layers 521 may be about 1.7 or higher. However, the present disclosure is not limited to this example.

Figure 11:
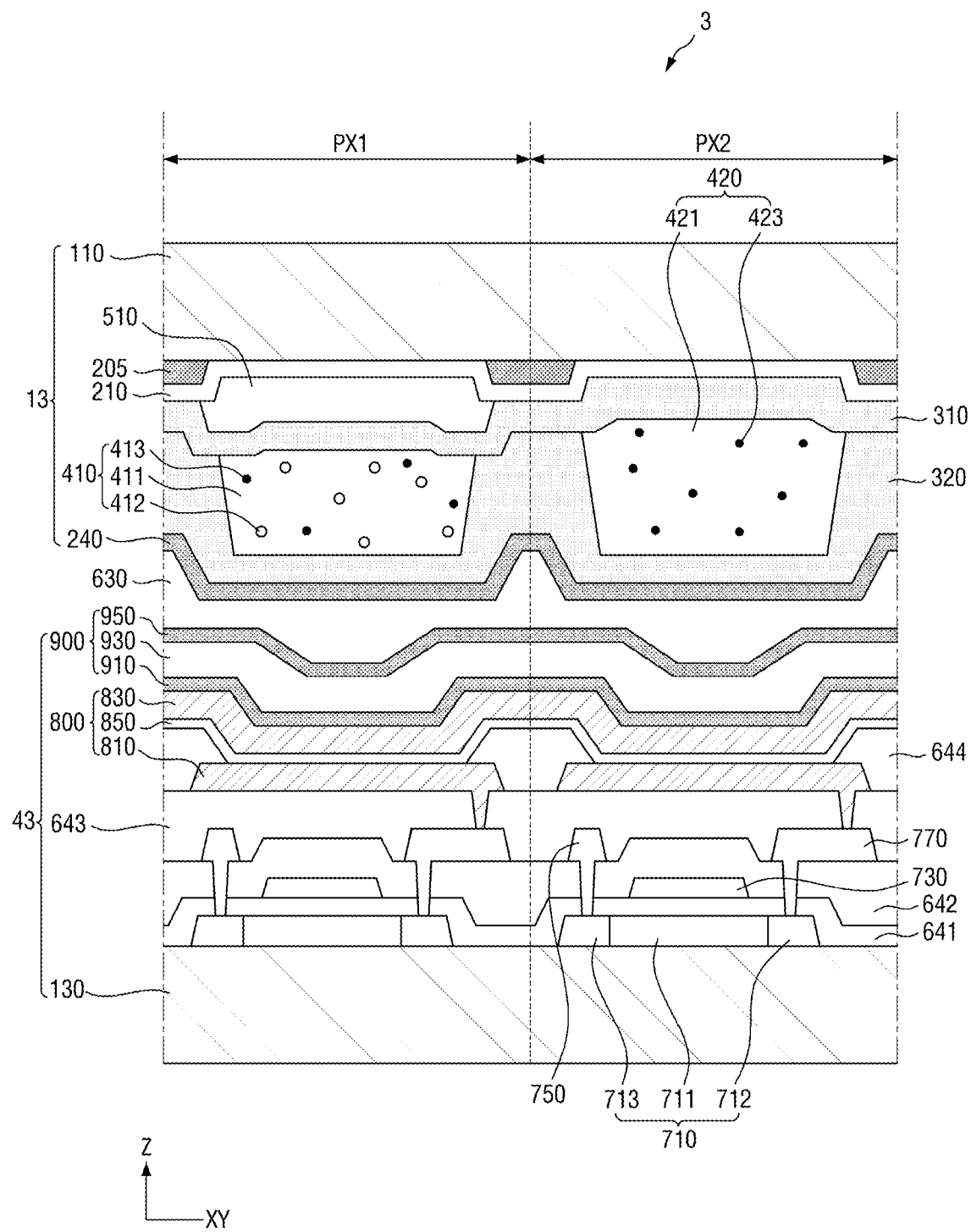
FIG. 11 is a cross-sectional view of a display device according to another exemplary embodiment.

FIG. 11 is a cross-sectional view of a display device according to another exemplary embodiment of the present disclosure.

Referring to FIG. 11, a display device 3, unlike the display device 1 of FIG. 2, is not an LCD device, but an organic light emitting display (OLED) device.

In one exemplary embodiment, the display device 3 may include an upper substrate 13 and a lower substrate 43. The upper substrate 13 may be a color conversion substrate including a color conversion pattern 410, a first low refractive layer 310, and a second low refractive layer 320. The color conversion pattern 410, the first low refractive layer 310, and the second low refractive layer 320 are substantially the same as their respective counterparts of FIG. 2, and thus, detailed descriptions thereof will not be repeated.

In some exemplary embodiments, a third passivation layer 240 may be disposed on the second low refractive layer 320. The third passivation layer 240 may include a non-metal inorganic material. Examples of the non-metal inorganic material include silicon oxide, silicon nitride, and silicon oxynitride. The third passivation layer 240 may prevent or reduce the infiltration of moisture or air and may thus prevent or reduce damage to wavelength shifters 412 of the color conversion pattern 410.

The lower substrate 43 may be an OLED substrate including a lower base substrate 130, TFTs, and light-emitting elements 800. That is, the lower substrate 43 may include self-emissive elements and may thus serve as a light source unit.

The lower base substrate 130 may be a transparent or opaque insulating substrate or film. For example, the lower base substrate 130 may include a glass material, a quartz material, or a flexible polymer material (such as polyimide (PI), polycarbonate (PC), polyethylene terephthalate (PET), or polyacrylate (PA)).

The TFTs may be disposed on the front surface (for example, in the case of FIG. 11, the top surface) of the lower base substrate 130. The TFTs may be driving transistors configured to control the amount of current flowing in active layers 710 via channel regions 711 and thus to control the amount of emission of the light-emitting elements 800. For example, the TFTs may include gate electrodes 730, which are control terminals, drain electrodes 750, which are input terminals, source electrodes 770, which are output terminals, and the active layers 710, which provide channels. FIG. 11 illustrates the TFTs as being top gate TFTs in which the gate electrodes 730 are disposed above the active layers 710, but alternatively, the TFTs may be bottom gate TFTs.

The active layers 710 may include a semiconductor material. For example, the active layers 710 may include polycrystalline Si. In another example, the active layers 710 may include monocrystalline Si, amorphous Si, or a non-Si-based semiconductor material such as an oxide semiconductor. The active layers 710 may include the channel regions 711, drain regions 713, and source regions 712. The channel regions 711 may be regions where paths that electrons or holes can move along in accordance with a voltage applied to the gate electrodes 730 are formed. The drain regions 713 and the source regions 712 may be spaced apart by the channel regions 711. That is, electrons or holes provided via the drain regions 713 may move to the source regions 712 via the channel regions 711, or electrons or holes provided via the source regions 712 may move to the drain regions 713 via the channel regions 711. The drain regions 713 and the source regions 712 may have higher electrical conductivity than the channel regions 711.

The gate electrodes 730 may be disposed on the active layers 710. The gate electrodes 730 may overlap with the channel regions 711 of the active layers 710 in a third direction Z. The gate electrodes 730 may be electrically connected to the output terminals of switching transistors, which control the turning on or off of a plurality of pixels (PX1 and PX2). The control terminals and the input terminals of the switching transistors may be electrically connected to scan signal lines and data signal lines, and the output terminals of the switching transistors may be configured to be turned on or off in accordance with a signal applied to the control signals of the switching transistors.

A first insulating layer 641 may be interposed between the active layers 710 and the gate electrodes 730, and may insulate the active layers 710 and the gate electrodes 730. A second insulating layer 642 may be disposed on the gate electrodes 730. The second insulating layers 642 may insulate the gate electrodes 730 and elements disposed on the second insulating layers 642. In some exemplary embodiments, the second insulating layers 642 may have a stack structure including multiple layers. The first and second insulating layers 641 and 642 may include an inorganic insulating material such as silicon nitride, silicon oxide, silicon nitride oxide, or silicon oxynitride. Through-holes, through which the drain regions 713 and the source regions 712 of the active layers 710 are exposed, may be formed in the first and second insulating layers 641 and 642.

The drain electrodes 750 and the source electrodes 770 may be disposed on the second insulating layers 642. The drain electrodes 750 and the source electrodes 770 may be inserted in the through-holes of the first and second insulating layers 641 and 642 and may be placed in contact with the active layers 710. Although not specifically illustrated, the drain electrodes 750 may be electrically connected to driving voltage lines, and the source electrodes 770 may be electrically connected to anodes 810 that will be described in more detail later.

An overcoat layer 643 may be disposed on the TFTs. The overcoat layer 643 may minimize or reduce height differences between multiple elements disposed on the lower base substrate 130. That is, the overcoat layer 643 may at least partially compensate for and planarize height differences and may thus provide spaces in which to stably dispose the light-emitting elements 800. The material of the overcoat layer 643 is not particularly limited as long as it has excellent insulation and planarization characteristics. For example, the overcoat layer 643 may include an acrylic resin, an epoxy resin, an imide resin, a cardo resin, or an ester resin.

The light-emitting elements 800 may be disposed on the overcoat layer 643. In one exemplary embodiment, the light-emitting elements 800 may be OLEDs including the anodes 810, a cathode 830, which is spaced apart from the anodes 810, an organic light-emitting layer 850, which is interposed between the anodes 810 and the cathode 830. In some exemplary embodiments, the light-emitting elements 800, which are disposed in first and second pixels PX1 and PX2 displaying a red color and a blue color, respectively, may emit light of the same color.

The anodes 810 may be disposed directly on the overcoat layer 643. The anodes 810 may be electrically connected to the source electrodes 770 via through-holes formed in the overcoat layer 643. The anodes 810 may be transparent electrodes, opaque electrodes, or stacks of the transparent electrodes and the opaque electrodes. Examples of the material of the transparent electrodes include ITO, IZO, ZnO, $In_2O_3$, IGO, and AZO, and examples of the material of the opaque electrodes include lithium (Li), Al, magnesium (Mg), Ag, Ni, and Cr. The anodes 810 may be pixel electrodes that are disposed in the plurality of pixels (PX1 and PX2) and receive a driving signal independently from one another.

The cathode 830 may be disposed on the anodes 810. The cathode 830 and the anodes 810 may be spaced apart by the organic light-emitting layer 850 and may drive the light-emitting elements 800 together. The cathode 830, like the anodes 810, may be a transparent electrode, an opaque electrode, or a stack of the transparent electrode and the opaque electrode. The cathode 830 may be a common electrode disposed across the first and second pixels PX1 and PX2 regardless of the distinction between the first and second pixels PX1 and PX2.

The organic light-emitting layer 850 may be interposed between the anodes 810 and the cathode 830. The organic light-emitting layer 850 may generate light by recombining holes and electrons provided by the anodes 810 and the cathode 830. For example, the holes and the electrons may be recombined in the organic light-emitting layer 850 so as to generate excitons, and in response to (e.g., accompanying) the transition of the excitons from an excited state to a ground state, light may be emitted. In one exemplary embodiment, the organic light-emitting layer 850 may emit blue light having a peak wavelength of about 430 nm to about 470 nm through fluorescent emission or phosphorescent emission. The organic light-emitting layer 850, which emits blue light, may be disposed across the first and second pixels PX1 and PX2. That is, the light-emitting element 800 disposed in the first pixel PX1 and the light-emitting element 800 disposed in the second pixel PX2 may both be blue light-emitting elements, but the present disclosure is not limited thereto. Although not specifically illustrated, the organic light-emitting layer 850, which is interposed between the anodes 810 and the cathode 830, may have a multilayer structure. That is, the light-emitting elements 800 may have a stack structure including multiple organic light-emitting layers 850 or a tandem structure. In some exemplary embodiments, functional layers such as hole control layers (i.e., a hole injection layer and a hole transport layer), electron control layers (i.e., an electron injection layer and an electron transport layer), a charge generation layer, and a buffer layer may be further disposed between the anodes 810 and the cathode 830.

In some exemplary embodiments, a pixel-defining film 644 may be disposed on the anodes 810. The pixel-defining film 644 may separate the plurality of pixels (PX1 and PX2) from one another. The pixel-defining film 644 may have openings that partially expose the surfaces of the anodes 810. That is, in a plan view, the pixel-defining film 644 may have openings that expose the anodes 810, which are disposed in the plurality of pixels (PX1 and PX2). The organic light-emitting layer 850 and the cathode 830 may be disposed on the pixel-defining film 644.

An encapsulation layer 900 may be disposed on the light-emitting elements 800. The encapsulation layer 900 may prevent or substantially prevent the light-emitting elements 800 from being damaged or deformed by the infiltration of impurities such as moisture or air. In one exemplary embodiment, the encapsulation layer 900 may include one or more inorganic encapsulation layers (910 and 950) and one or more organic encapsulation layers (930). For example, the encapsulation layer 900 may include a first inorganic encapsulation layer 910, which is disposed directly on the cathode 830 and includes an inorganic material, an organic encapsulation layer 930, which is disposed on the first inorganic encapsulation layer 910 and includes an organic material, and a second inorganic encapsulation layer 950, which is disposed on the organic encapsulation layer 930 and includes the inorganic material. Examples of the inorganic material include silicon oxide, silicon nitride, and silicon oxynitride, and examples of the organic material include an acrylic resin and an epoxy resin. FIG. 11 illustrates the encapsulation layer 900 as including three layers, but the present disclosure is not limited thereto. In some exemplary embodiments, the encapsulation layer 900 may include a siloxane-based encapsulation layer including, for example, hexamethyldisiloxane.

The upper substrate 13, which includes the color conversion pattern 410, and the lower substrate 43, which includes the light-emitting elements 800, may be coupled together by a bonding layer 630. For example, the bonding layer 630 may be disposed between the encapsulation layer 900 and the third passivation layer 240, may fill the gap between the encapsulation layer 900 and the third passivation layer 240, and may couple the encapsulation layer 900 and the third passivation layer 240. The bonding layer 630 may be an organic layer including an organic material including a thermosetting resin or a photocurable resin.

Methods of manufacturing a display device according to exemplary embodiments of the present disclosure will hereinafter be described.

FIGS. 12 through 20 are schematic views illustrating a method of manufacturing a display device according to an exemplary embodiment of the present disclosure.

Figure 12:
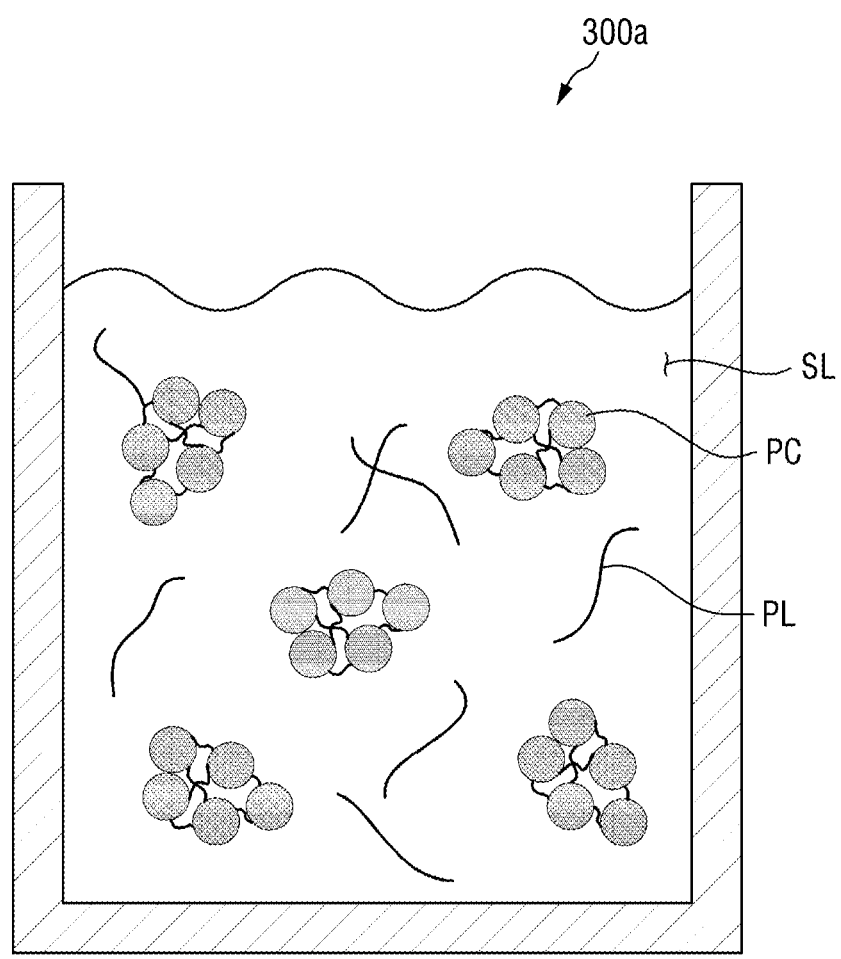
FIGS. 12 through 20 are schematic views illustrating a method of manufacturing a display device according to an exemplary embodiment.

Referring to FIG. 12, particle clusters PC and a siloxane-based polymer PL are prepared, and a dispersion 300a of the particle clusters PC and the siloxane-based polymer PL is prepared.

In one exemplary embodiment, the act (e.g., step) of preparing the particle clusters PC and the siloxane-based polymer PL may include preparing particles and a silanol compound, mixing the particles and the silanol compound, and forming the particle clusters PC and the siloxane-based polymer PL at the same time through a dehydration reaction.

The particles may be silica particles. For example, the particles may be hollow silica particles or non-hollow silica particles. The particle size of the hollow silica particles may be, for example, about 50 nm to about 100 nm. The particle size of the non-hollow silica particles may be, for example, about 10 nm to about 30 nm.

The silanol compound may include at least one of the compounds represented by Formulas 2 through 4 below.

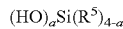  Formula 2

  Formula 3

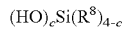  Formula 4

Referring to Formula 2, a is an integer of 2 to 4, $R^5$ is an alkyl group having 1 to 12 carbon atoms or an alkoxy group having 1 to 12 carbon atoms. Referring to Formula 3, b is an integer of 2 or 3, $R^6$ is fluorine or an alkyl fluoride group having 1 to 12 carbon atoms, and $R^7$ is an alkyl group having 1 to 12 carbon atoms or an alkoxy group having 1 to 12 carbon atoms. Referring to Formula 4, c is an integer of 2 to 4, and $R^8$ is a vinyl group, an allyl group, or a (meth)acryl group.

The silica particles and the silanol compound may be combined through a dehydration reaction to form the particle clusters PC, but the present disclosure is not limited thereto. The particle clusters PC may include particles and bridges that couple the particles. The bridges may include polysiloxane bonds. The particle clusters PC have already been described above, and thus, a detailed description thereof will not be repeated.

The silanol compound may form a siloxane-based polymer represented by Formula 1 below through a dehydration reaction, but the present disclosure is not limited thereto.

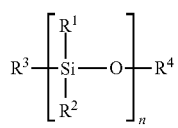  Formula 1

$R^1$, $R^2$, $R^3$, and $R^4$ of Formula 1 have already been described above, and thus, detailed descriptions thereof will not be repeated.

The weight-average molecular weight of the siloxane-based polymer PL may be about 100 g/mol to about 10,000 g/mol. When the weight-average molecular weight of the siloxane-based polymer PL is about 100 g/mol or greater, the siloxane-based polymer PL can serve as a matrix for dispersing the particle clusters PC in the process of forming a low refractive layer. Also, when the weight-average molecular weight of the siloxane-based polymer PL is about 10,000 g/mol or less, the siloxane-based polymer PL can improve the processability and the planarization and adhesion characteristics of a low refractive layer.

In some exemplary embodiments, in the act (e.g., step) of preparing the particle clusters PC and the siloxane-based polymer FL, the mixing weight ratio of the particles to the silanol compound may be about 7:3 to about 9:1. When the content of the particles is 70 wt % or greater, pores or voids can be sufficiently formed between the particles during the formation of the particle clusters PC, and as a result, the formation of a low refractive layer can be facilitated. When the content of the particles exceeds 90 wt %, the coagulation of the particles occurs. As a result, the coating processability and the rigidity of a low refractive layer can be lowered, and the refractive index of a low refractive layer can become irregular. In this case, when a low refractive layer is applied to a display device, haze increases, and as a result, the luminance of the display device may deteriorate.

In the act (e.g., step) of preparing the particle clusters PC and the siloxane-based polymer PL, the particle size of the particle clusters PC may be about 50 nm to about 1,000 nm.

The act (e.g., step) of preparing the dispersion 300a may include the act (e.g., step) of dispersing or dissolving the particle clusters PC and the siloxane-based polymer PL in a solvent SL.

The solvent SL is not particularly limited as long as it has chemical stability with respect to the particle clusters PC and the siloxane-based polymer PL, and also has excellent dispersion characteristics for the particle clusters PC and excellent solubility characteristics for the siloxane-based polymer PL to prevent or substantially prevent coagulation between the particle clusters PC and the siloxane-based polymer PL. Examples of the solvent SL include propylene glycol monomethyl ether acetate (PGMEA), ethylene glycol mono-tert-butyl ether (ETB), propylene glycol methyl ether (PGME), 3-methoxybutyl acetate, isopropyl alcohol (IPA), propyl acetate, and 3-methoxy-butanol.

In some exemplary embodiments, the content of the solvent SL to the dispersion 300a may be about 90 wt % or greater and about 98 wt % or less. When the content of the solvent SL is about 90 wt % or greater, the particle clusters PC can be sufficiently dispersed while minimizing or reducing the coagulation of the particle clusters PC, and the siloxane-based polymer PL can be sufficiently dissolved. When the solid content of the particle clusters PC and the siloxane-based polymer PL is about 2.0 wt % or greater, a low refractive layer having a uniform refractive index can be formed.

Figure 13:
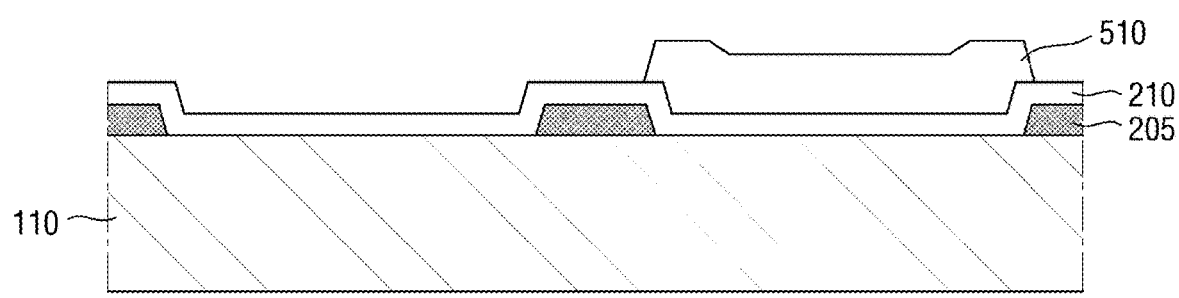

Thereafter, referring to FIG. 13, a base substrate 110, light-shielding patterns 205, and a first wavelength band filter 510 are prepared. The base substrate 110, the light-shielding patterns 205, and the first wavelength band filter 510 have already been described above, and thus, detailed descriptions thereof will not be repeated.

Figure 14:
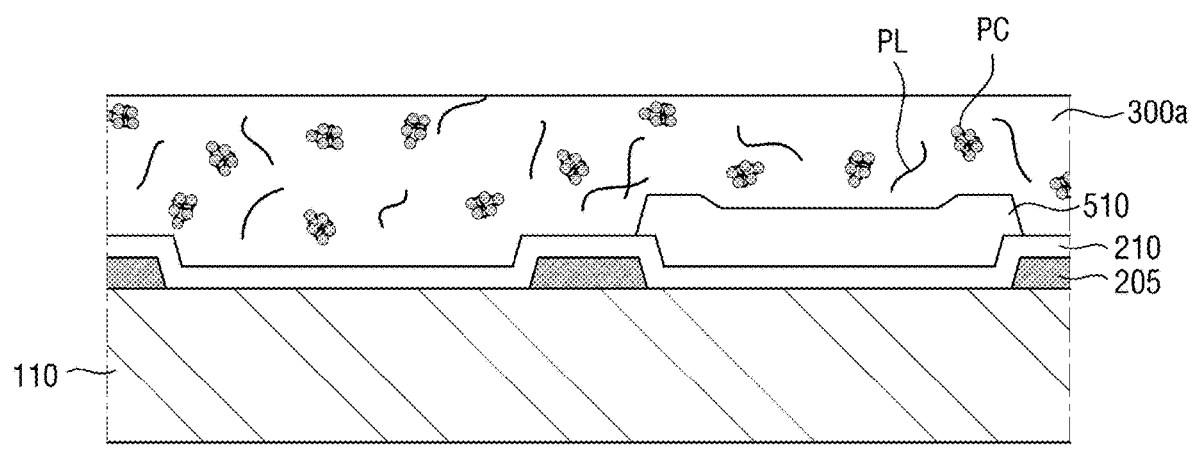

Thereafter, referring to FIG. 14, the dispersion 300a is applied onto the first wavelength band filter 510 of FIG. 13. A method to apply the dispersion 300a is not particularly limited. For example, the dispersion 300a may be applied by slit coating or spin coating. In the act (e.g., step) of applying the dispersion 300a, the particle clusters PC may be in a state of being substantially uniformly dispersed in the solvent SL, and the siloxane-based polymer PL may be in a state of being dissolved in the solvent SL.

Figure 15:
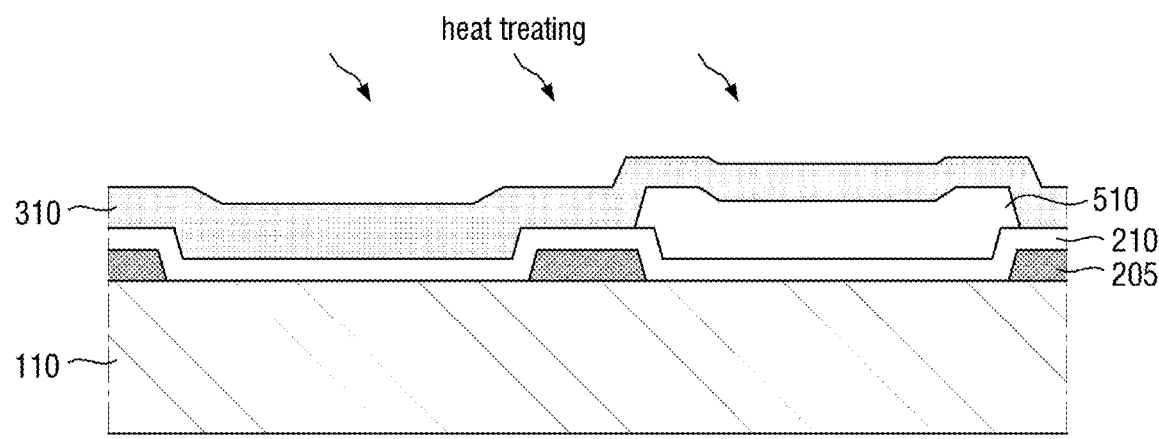

Thereafter, referring to FIG. 15, a first low refractive layer 310 is formed by heat-treating the dispersion 300a applied on the first wavelength band filter 510. In one exemplary embodiment, the act (e.g., step) of heat-treating the dispersion 300a applied on the first wavelength band filter 510 may include the acts (e.g., steps) of performing a pre-baking operation on the dispersion 300a applied on the first wavelength band filter 510 and preforming a main baking operation on the dispersion 300a applied on the first wavelength band filter 510. For example, the act (e.g., step) of performing a pre-baking operation on the dispersion 300a applied on the first wavelength band filter 510 may be performed at a temperature of about 80° C. to about 120° C. for about 60 seconds to about 300 seconds, and the act (e.g., step) of performing a main baking operation on the dispersion 300a applied on the first wavelength band filter 510 may be performed at a temperature of about 180° C. to about 250° C. for about 10 minutes to about 60 minutes. However, the present disclosure is not limited to this example.

By heat-treating the dispersion 300a applied on the first wavelength band filter 510, the first low refractive layer 310, which includes a base resin and particle clusters dispersed in the base resin, may be obtained. The base resin may be a matrix obtained by curing the siloxane-based polymer PL in the dispersion 300a. The thickness of the first low refractive layer 310 may vary from one area to another area.

The first low refractive layer 310, which includes the base resin and the particle clusters, may have an average refractive index of about 1.1 to about 1.4 or about 1.15 to about 1.3. The first low refractive layer 310 has already been described above, and thus, a detailed description thereof will not be repeated.

Figure 16:
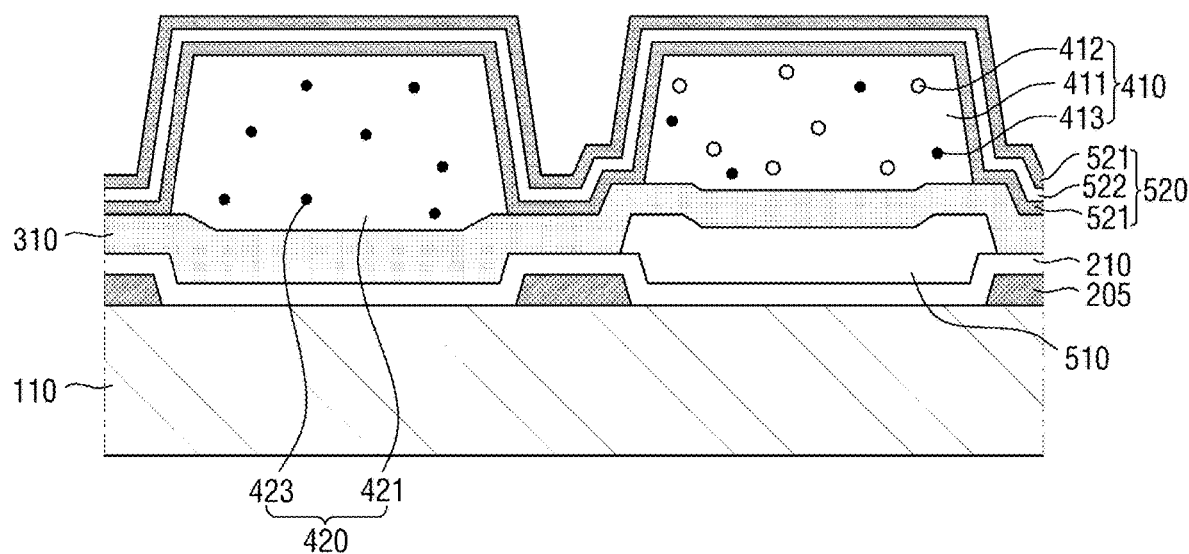

Thereafter, referring to FIG. 16, a color conversion pattern 410, a scattering pattern 420, and a second wavelength band filter 520 are formed on the first low refractive layer 310. The color conversion pattern 410, the scattering pattern 420, and the second wavelength band filter 520 have already been described above, and thus, detailed descriptions thereof will not be repeated.

Figure 17:
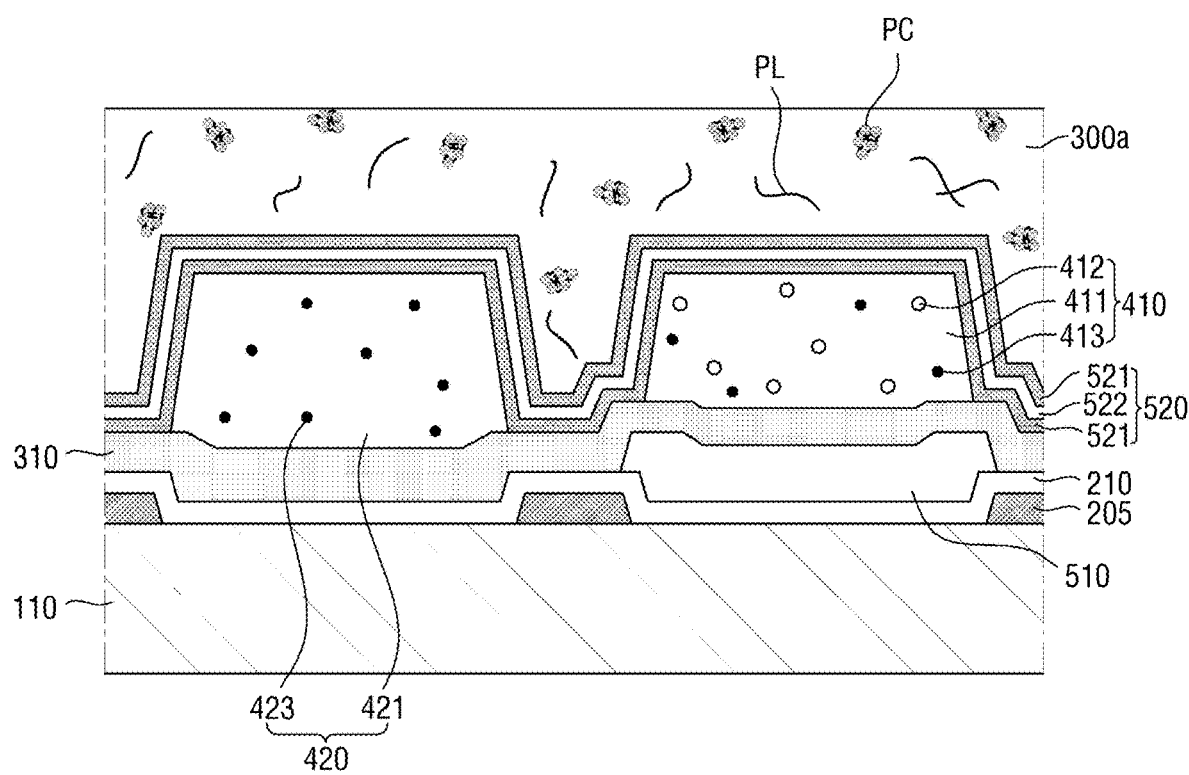

Thereafter, referring to FIG. 17, the dispersion 300a is applied on the second wavelength band filter 520 of FIG. 16. A method to apply the dispersion 300a on the second wavelength band filter 520 is not particularly limited. For example, the dispersion 300a may be applied by slit coating or spin coating. In the act (e.g., step) of applying the dispersion 300a on the second wavelength band filter 520, the particle clusters PC may be in a state of being substantially uniformly dispersed in the solvent SL, and the siloxane-based polymer PL may be in a state of being dissolved in the solvent SL.

Figure 18:
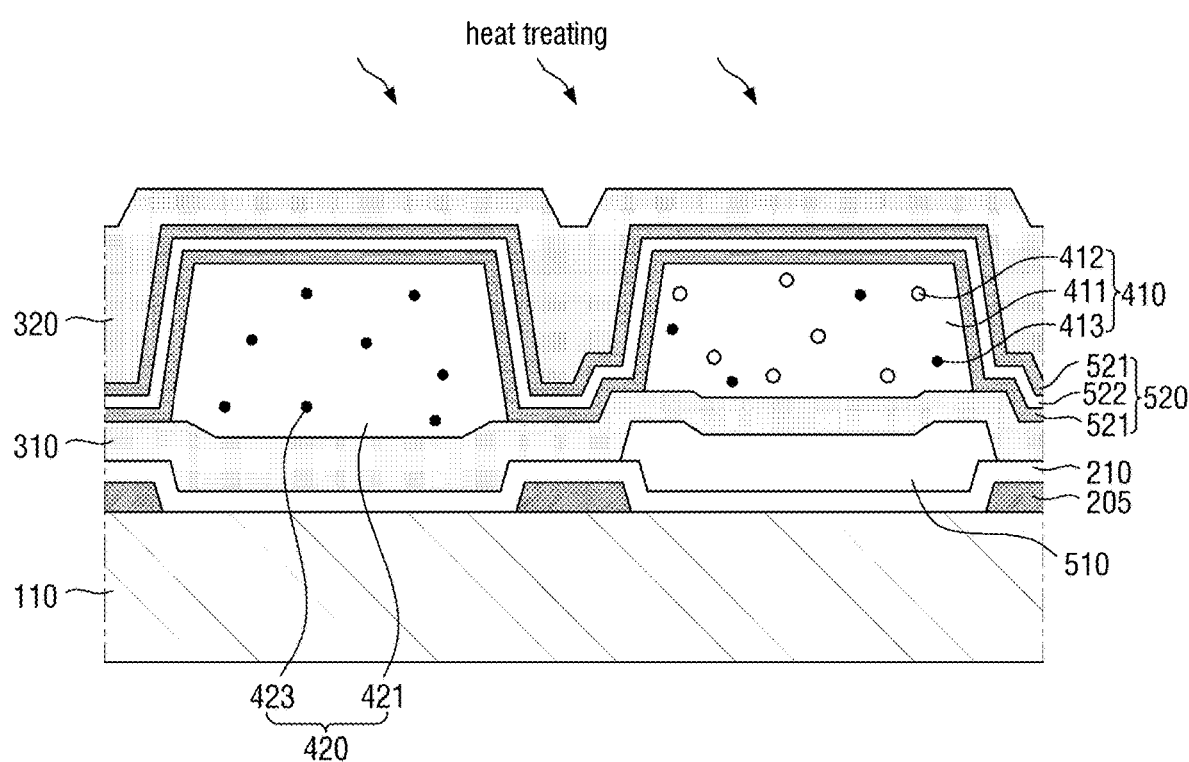

Thereafter, referring to FIG. 18, a second low refractive layer 320 is formed by heat-treating the dispersion 300a applied on the second wavelength band filter 520. In one exemplary embodiment, the act (e.g., step) of heat-treating the dispersion 300a applied on the second wavelength band filter 520 may include the acts (e.g., steps) of performing a pre-baking operation on the dispersion 300a applied on the second wavelength band filter 520 and preforming a main baking operation on the dispersion 300a applied on the second wavelength band filter 520. The acts (e.g., steps) of performing a pre-baking operation and a main baking operation for forming the second low refractive layer 320 may be the same as their respective counterparts for forming the first low refractive layer 310.

By heat-treating the dispersion 300a applied on the second wavelength band filter 520, the second low refractive layer 320, which includes a base resin and particle clusters dispersed in the base resin, may be obtained. The second low refractive layer 320 may at least partially alleviate height differences formed by elements stacked on the base substrate 110.

The second low refractive layer 320, which includes the base resin and the particle clusters, may have an average refractive index of about 1.1 to about 1.4 or about 1.15 to about 1.3. The second low refractive layer 320 has already been described above, and thus, a detailed description thereof will not be repeated.

Figure 19:
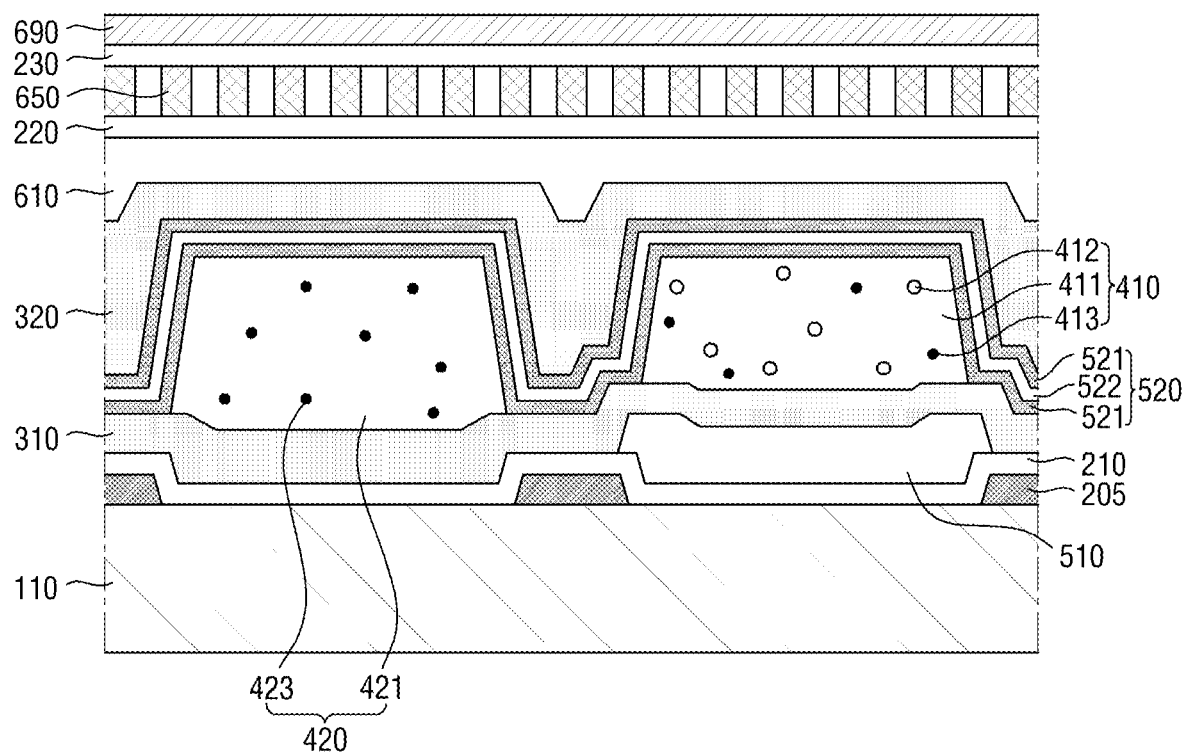

Thereafter, referring to FIG. 19, linear patterns 650 and a common electrode 690 are formed on the second low refractive layer 320. The linear patterns 650 and the common electrode 690 have already been described above, and thus, detailed descriptions thereof will not be repeated.

Figure 20:
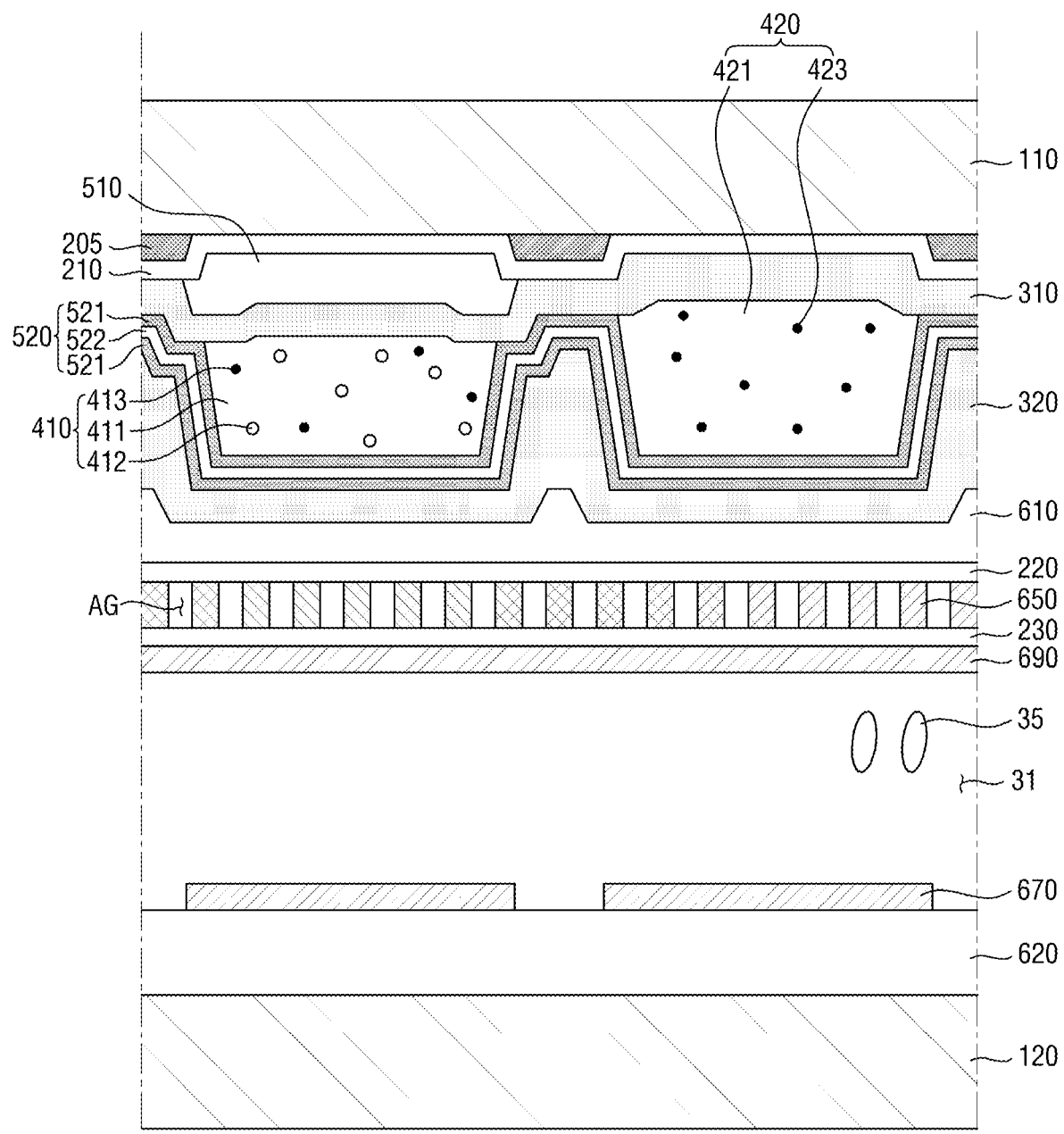

Thereafter, referring to FIG. 20, a substrate including switching elements and pixel electrodes 670 is prepared, and a liquid crystal layer 31 is interposed.

FIGS. 21 through 28 are schematic views illustrating a method of manufacturing a display device according to another exemplary embodiment of the present disclosure.

Figure 21:
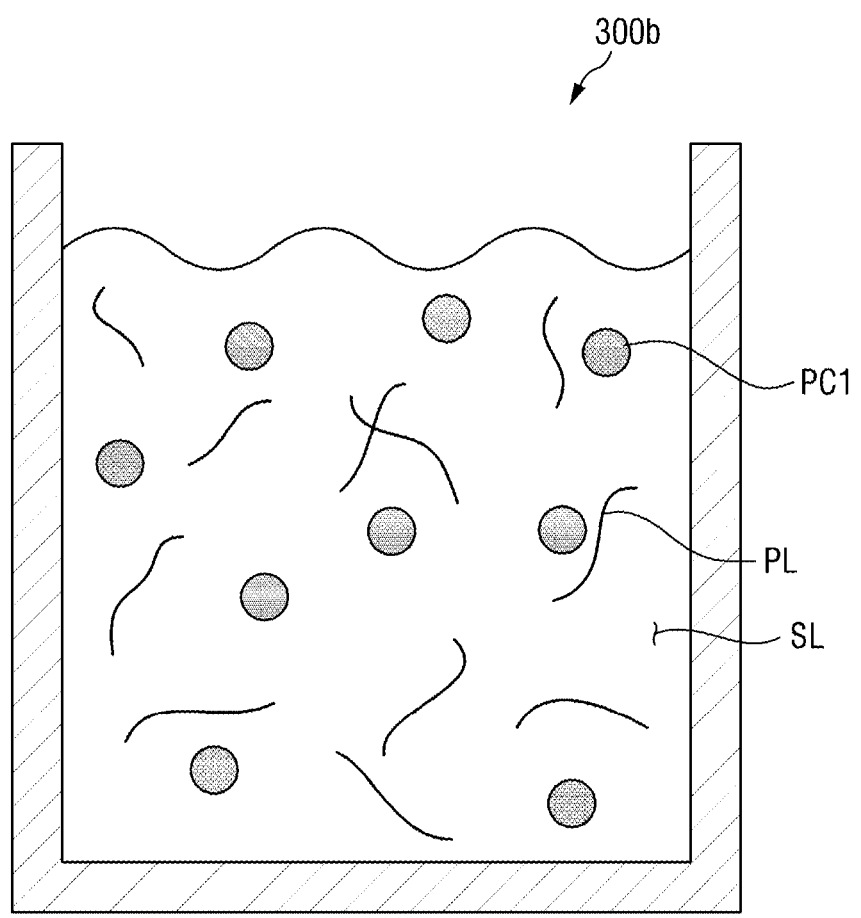
FIGS. 21 through 28 are schematic views illustrating a method of manufacturing a display device according to another exemplary embodiment.

Referring to FIG. 21, particles PC1 and a siloxane-based polymer PL are prepared, and a dispersion 300b of the particles PC1 and the siloxane-based polymer PL is prepared.

In one exemplary embodiment, the particles PC1 may be non-hollow silica particles. The particle size of the non-hollow silica particles may be about 10 nm to about 30 nm. By using fine non-hollow silica particles in forming lower refractive layers, sufficiently large pores or voids can be formed in the process of forming particle clusters.

The weight-average molecular weight of the siloxane-based polymer PL may be about 100 g/mol to about 10,000 g/mol. The siloxane-based polymer PL may be the same as the siloxane-based polymer represented by Formula 1 above, and thus, a detailed description thereof will not be repeated.

The act (e.g., step) of preparing the dispersion 300b may include the act (e.g., step) of dispersing or dissolving the particles PC1 and the siloxane-based polymer PL in a solvent SL.

In some exemplary embodiments, in the act (e.g., step) of preparing the dispersion 300b, the mixing weight ratio of the particles PC1 to the siloxane-based polymer PL may be about 7:3 to about 9:1. When the content of the particles PC1 is 70 wt % or greater, pores or voids may be sufficiently formed between the particles PC1 during the formation of particle clusters, and as a result, the formation of a low refractive layer may be facilitated. When the content of the particles PC1 exceeds 90 wt %, the coagulation of the particles PC1 occurs. In this case, when a low refractive layer is applied to a display device, haze increases, and as a result, the luminance of the display device may deteriorate.

Examples of the solvent SL include PGMEA, ETB, PGME, 3-methoxybutyl acetate, IPA, propyl acetate, and 3-methoxy-butanol.

In some exemplary embodiments, the content of the solvent SL to the dispersion 300b may be about 90 wt % or greater and about 98 wt % or less.

Figure 22:
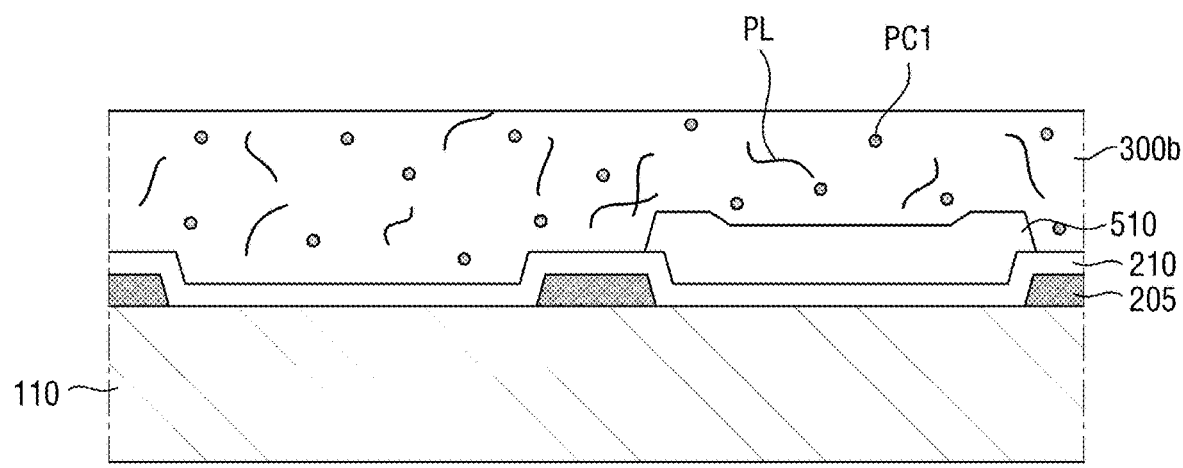

Thereafter, referring to FIG. 22, a base substrate 110, light-shielding patterns 205, and a first wavelength band filter 510 are prepared, and the dispersion 300b of FIG. 21 is applied. In the act (e.g., step) of applying the dispersion 300b, the particles PC1 may be in a state of being substantially uniformly dispersed in the solvent SL, and the siloxane-based polymer PL may be in a state of being dissolved in the solvent SL.

Figure 23:
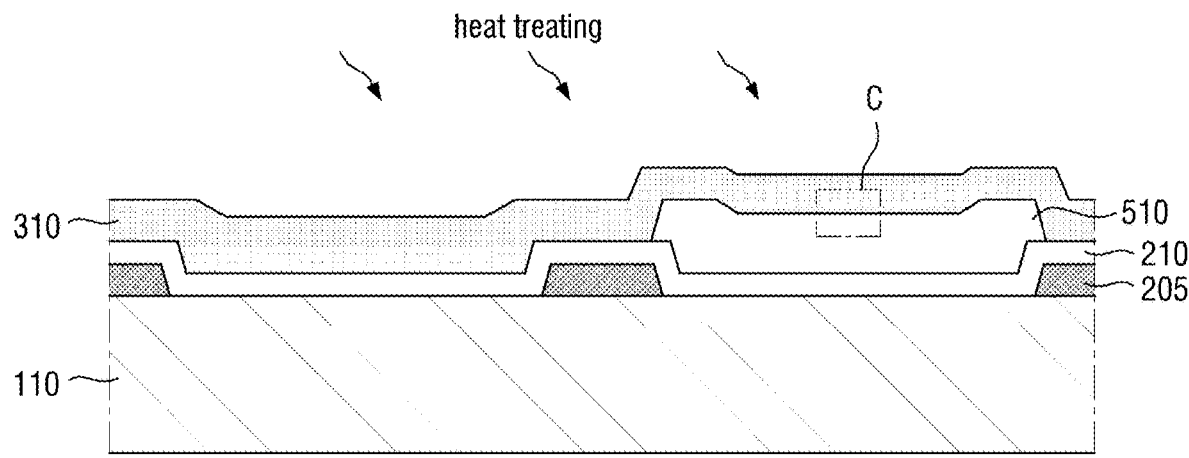

Thereafter, referring to FIG. 23, a first low refractive layer 310 is formed by heat-treating the dispersion 300b. In one exemplary embodiment, the act (e.g., step) of heat-treating the dispersion 300b may include the acts (e.g., steps) of performing a pre-bakin g operation on the dispersion 300b and preforming a main baking operation on the dispersion 300b. The act (e.g., step) of performing a pre-baking operation on the dispersion 300b may be performed at a temperature of about 80° C. to about 120° C. for about 60 seconds to about 300 seconds. The act (e.g., step) of performing a main baking operation on the dispersion 300b may be performed at a temperature of about 180° C. to about 250° C. for about 10 minutes to about 60 minutes.

Figure 24:
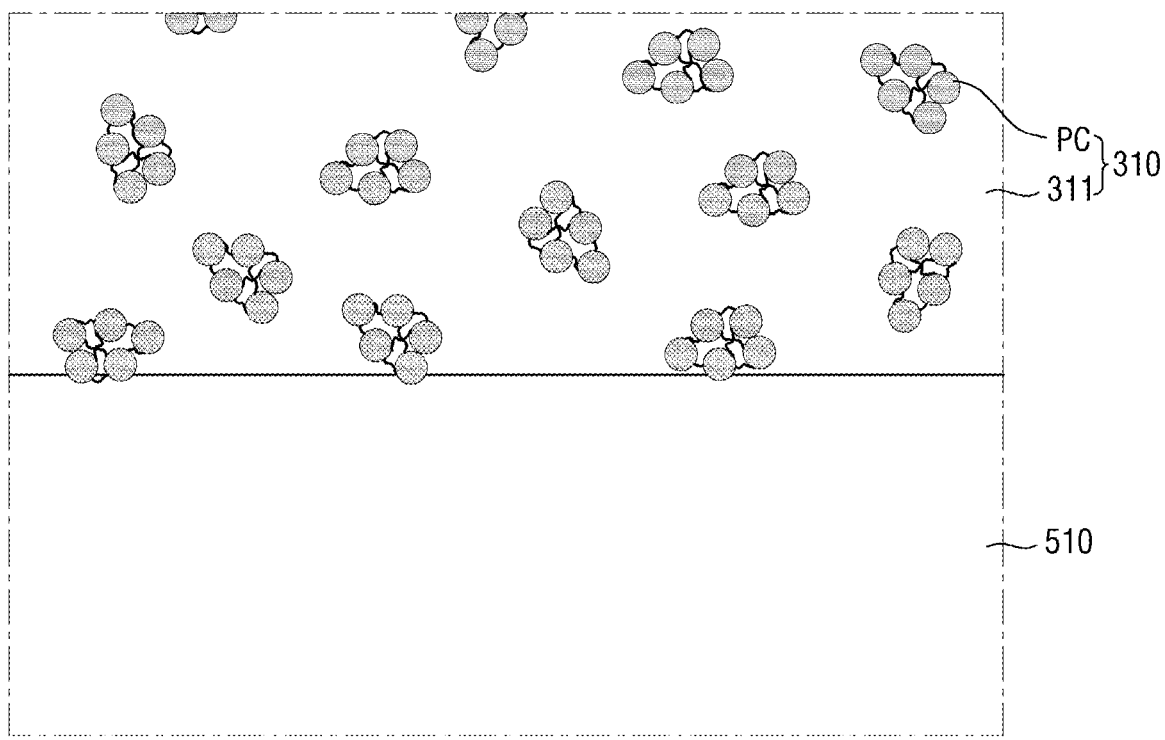

FIG. 24 is an enlarged view of an area C of FIG. 23. Referring to FIGS. 23 and 24, in the act (e.g., step) of performing a main baking operation on the dispersion 300b, the particles PC1 and the siloxane-based polymer PL may be bonded. For example, bonds may be formed through dehydration reactions between hydroxyl groups on the surfaces of the particles PC1 and the siloxane-based polymer PL, and as a result, particle clusters PC, which include the particles PC1 and bridges having polysiloxane bonds that bond the particles PC1, may be formed.

The first low refractive layer 310 has already been described above, and thus, a detailed description thereof will not be repeated.

Figure 25:
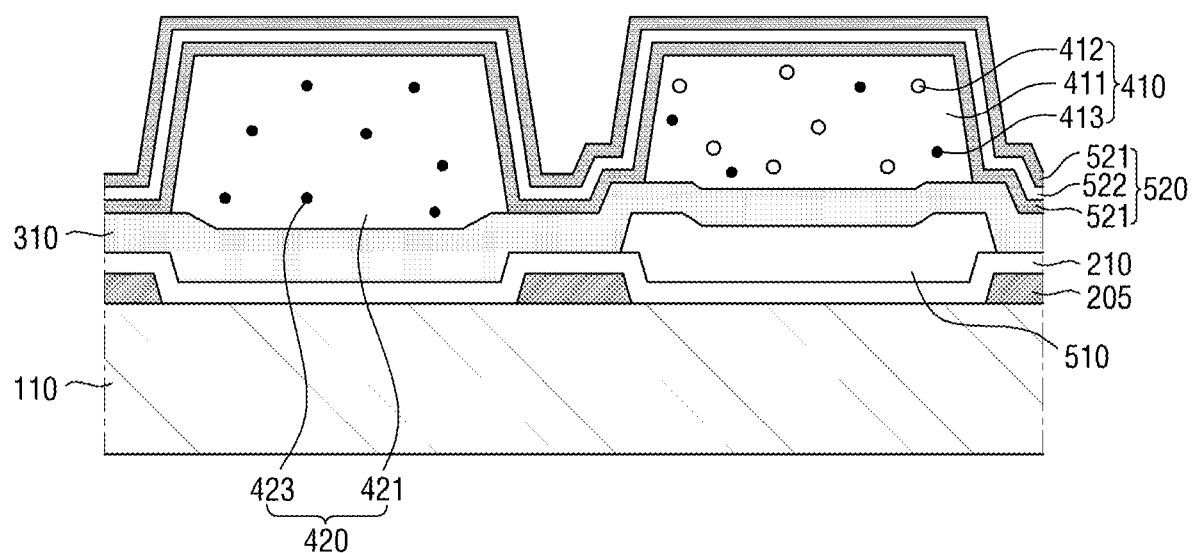

Thereafter, referring to FIG. 25, a color conversion pattern 410, a scattering pattern 420, and a second wavelength band filter 520 are formed on the first low refractive layer 310. The color conversion pattern 410, the scattering pattern 420, and the second wavelength band filter 520 have already been described above, and thus, detailed descriptions thereof will not be repeated.

Figure 26:
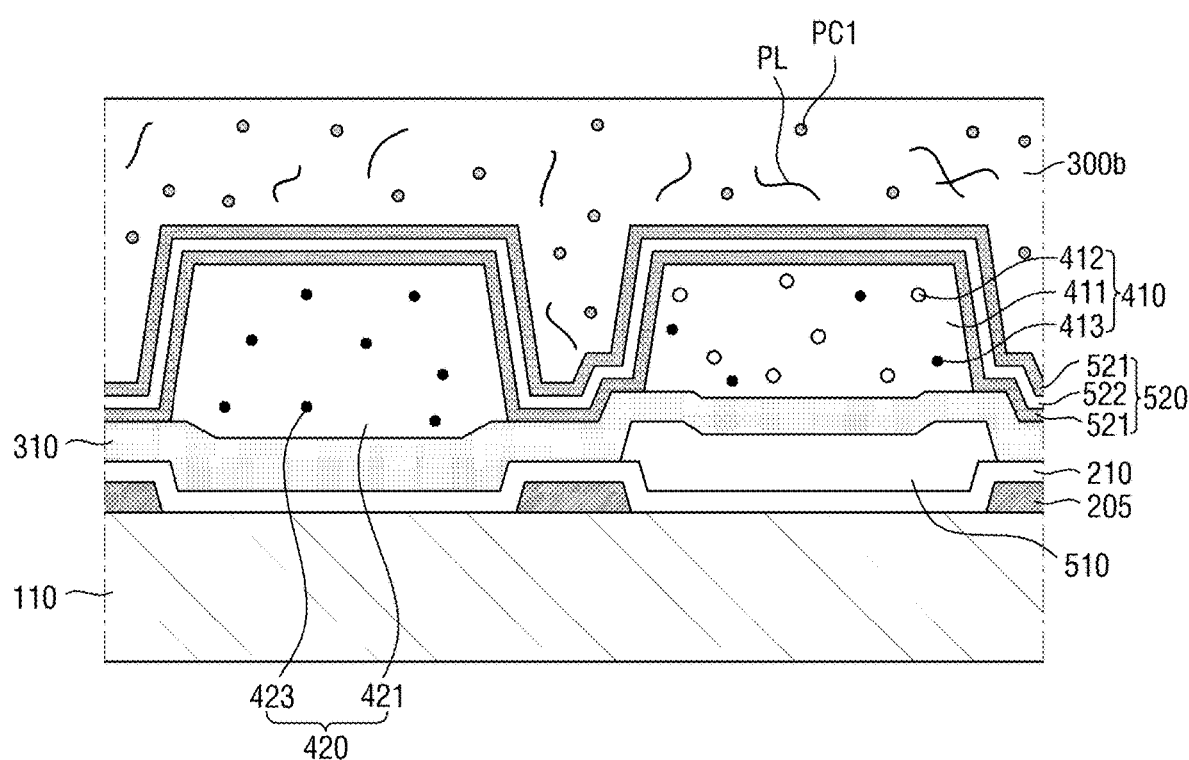

Thereafter, referring to FIG. 26, the dispersion 300b of FIG. 21 is applied on the second wavelength band filter 520. In the act (e.g., step) of applying the dispersion 300b on the second wavelength band filter 520, the particle clusters PC may be in a state of being substantially uniformly dispersed in the solvent SL, and the siloxane-based polymer PL may be in a state of being dissolved in the solvent SL.

Figure 27:
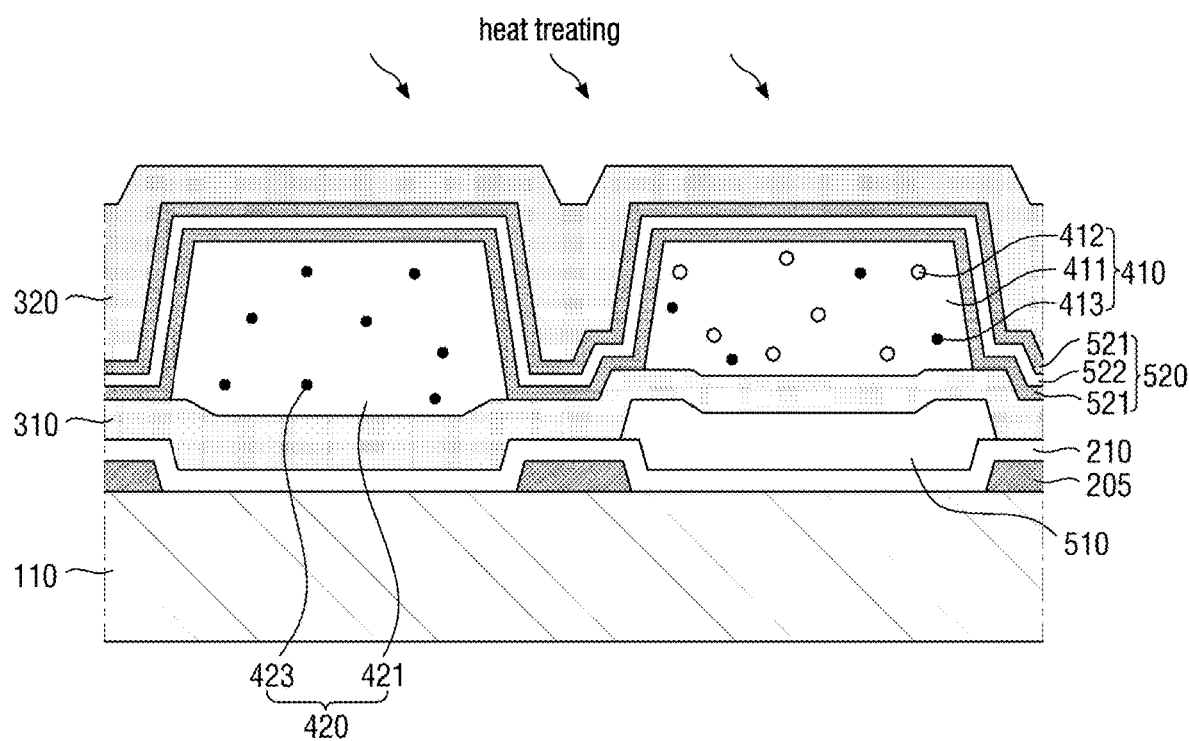

Thereafter, referring to FIG. 27, a second low refractive layer 320 is formed by heat-treating the dispersion 300b applied on the second wavelength band filter 520. In one exemplary embodiment, the act (e.g., step) of heat-treating the dispersion 300b applied on the second wavelength band filter 520 may include the acts (e.g., steps) of performing a pre-baking operation on the dispersion 300b applied on the second wavelength band filter 520 and preforming a main baking operation on the dispersion 300b applied on the second wavelength band filter 520. In the act (e.g., step) of performing a main baking operation on the dispersion 300b applied on the second wavelength band filter 520, bonds may be formed between the particles PC1 and the siloxane-based polymer PL, and as a result, particle clusters may be formed. The acts (e.g., steps) of performing a pre-baking operation and a main baking operation for forming the second low refractive layer 320 may be the same as their respective counterparts for forming the first low refractive layer 310.

Figure 28:
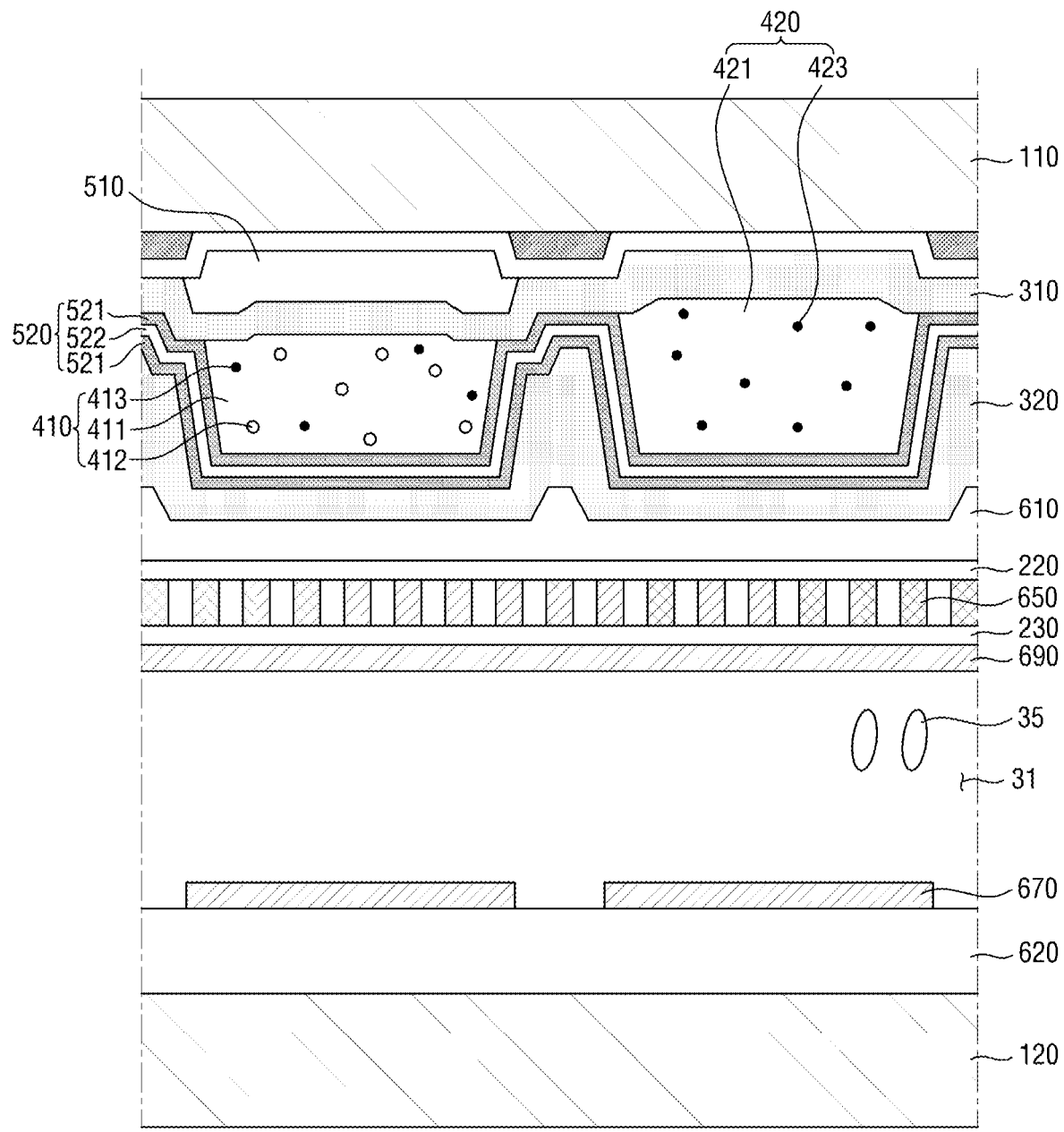

Thereafter, referring to FIG. 28, linear patterns 650 and a common electrode 690 are formed on the second low refractive layer 320, a substrate including switching elements and pixel electrodes 670 is prepared, and a liquid crystal layer 31 is interposed.

The above-described exemplary embodiments of the present disclosure will hereinafter be described in further detail with reference to various Examples, comparative examples, and experimental examples.

EXAMPLE 1

A test cell of a display device having substantially the same structure as the display device 1 of FIG. 2 was fabricated by forming a first low refractive layer and a color conversion pattern, including quantum dot particles emitting red light, but without forming a second low refractive layer.

EXAMPLE 2

A test cell of a display device having substantially the same structure as the display device 1 of FIG. 2 was fabricated by forming a first low refractive layer, a color conversion pattern, including quantum dot particles emitting red light, and a second refractive layer.

COMPARATIVE EXAMPLE

A test cell of a display device was fabricated in substantially the same manner as the test cell of the display device according to Example 2, but without forming a first refractive layer and a second refractive layer.

EXPERIMENTAL EXAMPLE

Figure 29:
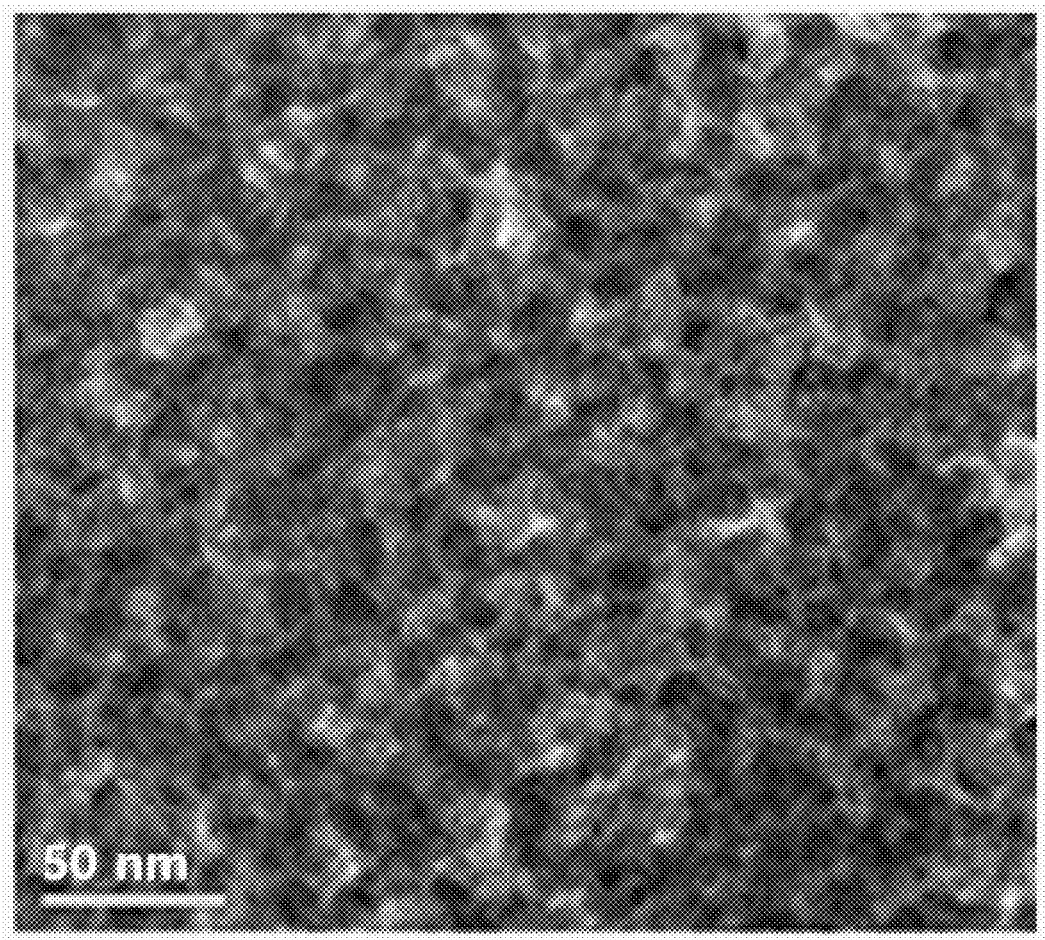
FIG. 29 is a microscope image of the first low refractive layer of the display device according to Example 1.

Evaluation of Influence of Presence of Low Refractive Layer(s) on Utilization Efficiency of Light A microscope image of the first low refractive layer of the display device according to Example 1 is shown in FIG. 29.

Figure 30:
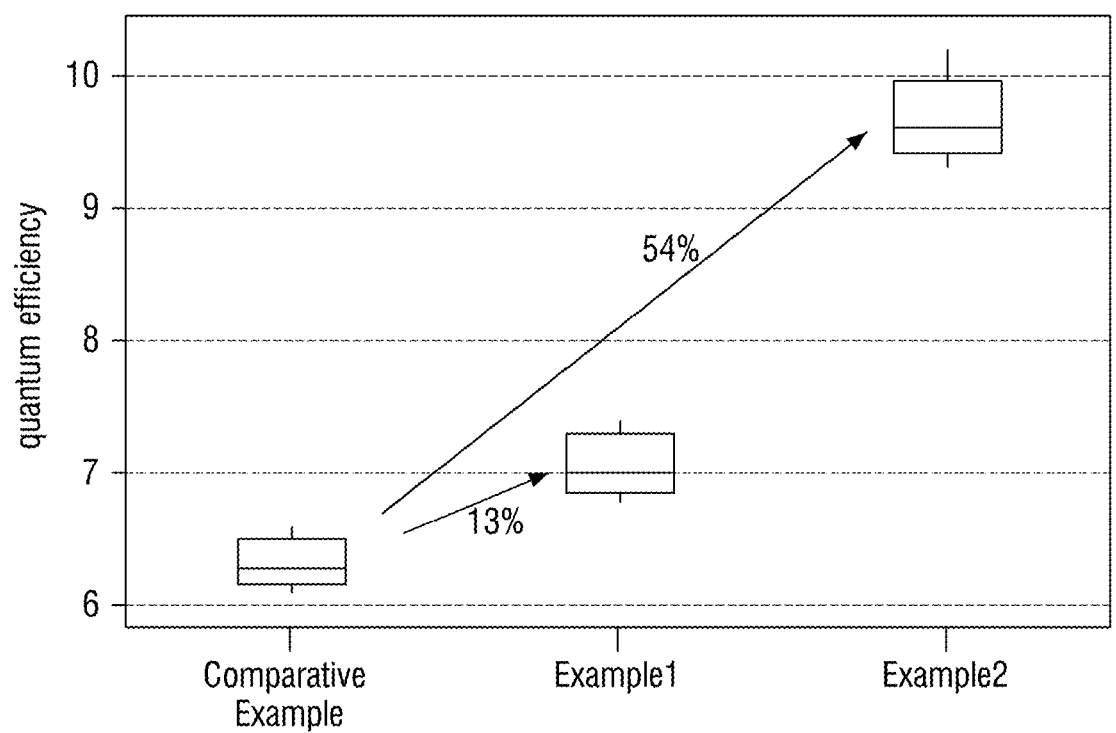
FIG. 30 shows the quantum efficiencies of the test cells of the display devices according to Example 1, Example 2, and the Comparative Example.

The results of the evaluation of the light utilization efficiencies of the test cells of the display devices according to Example 1, Example 2, and the Comparative Example are as shown in FIG. 30. Referring to FIG. 30, "quantum efficiency" represents data obtained by measuring the amount of red light emitted from each of the test cells of the display devices according to Example 1, Example 2, and the Comparative Example, and quantifying the result of the measurement as an integration ratio.

Referring to FIG. 30, the light utilization efficiency of the test cell of the display device according to Example 1, which includes a first low refractive layer, but not a second low refractive layer, is improved by about 13% as compared to the light utilization efficiency of the test cell of the display device according to the Comparative Example, and the light utilization efficiency of the test cell of the display device according to Example 2, which includes both a first low refractive layer and a second low refractive layer, is improved by about 54% as compared to the light utilization efficiency of the test cell of the display device according to the Comparative Example.

EXPERIMENTAL EXAMPLE

Evaluation of Adhesiveness of Low Refractive Layer

A dispersion of particle clusters and a siloxane-based polymer was prepared. Then, a silicon nitride film was deposited on a glass substrate. Thereafter, a low refractive layer having the particle clusters dispersed therein was formed by applying and heat-treating the prepared dispersion on the silicon nitride film. An adhesive tape was applied on and then peeled off from the low refractive layer, and an image of the resulting glass substrate is as shown in FIG. 31.

Figure 31:
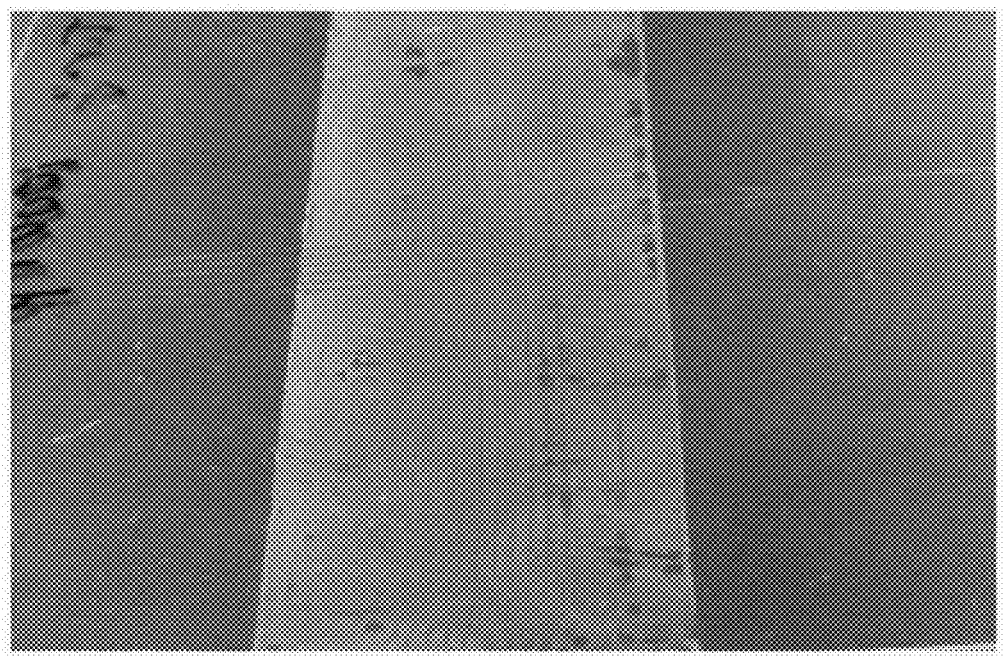
FIG. 31 shows the result of evaluation of adhesiveness of a low refractive Layer.

Referring to FIG. 31, it is clear that the low refractive layer still remains on the glass substrate. It is also clear that even the adhesive layer of the adhesive tape remains attached on the low refractive layer, and this indicates that the adhesiveness (e.g., the adhesion) of the low refractive layer to the silicon nitride film is excellent.

EXPERIMENTAL EXAMPLES

Evaluation of Transmittance of Low Refractive Layer

A silicon nitride film was formed on a glass substrate, and a low refractive layer was formed on the silicon nitride film to have a thickness of about 0.9 µm (Experimental Example 1). A silicon nitride film was formed on a glass substrate, and a low refractive layer was formed on the silicon nitride film to have a thickness of about 2.7 µm (Experimental Example 2).

Figure 32:
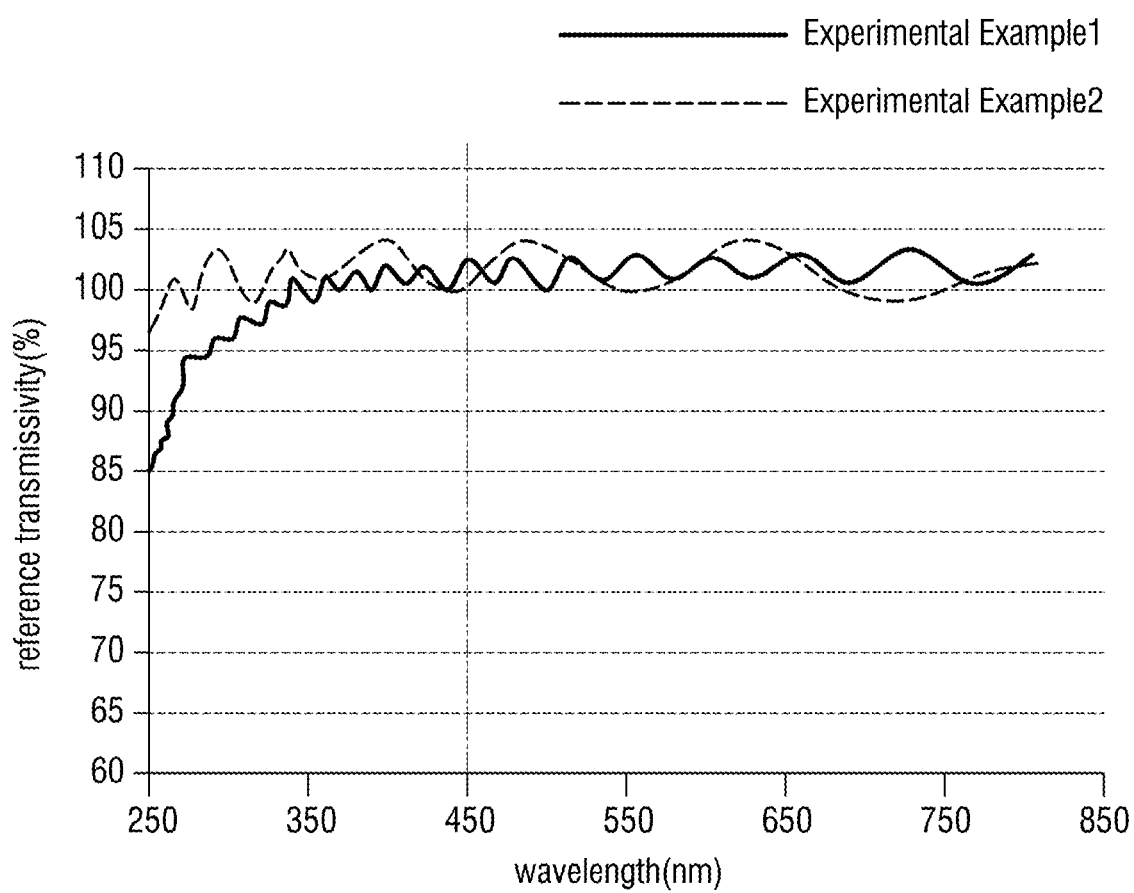
FIG. 32 shows the reference transmissivity of the glass substrates prepared in accordance with Experimental Examples 1 and 2.

The transmittances of the glass substrates prepared in accordance with Experimental Examples 1 and 2 were measured for light having a wavelength of 250 nm to 850 nm, and the results are as shown in FIG. 32. Referring to FIG. 32, "reference transmissivity" represents data obtained by measuring the transmittance of each of the glass substrates prepared in accordance with Experimental Examples 1 and 2 and quantifying the result of the measurement as a percentage.

Referring to FIG. 32, the glass substrates prepared in accordance with Experimental Examples 1 and 2 both show a transmittance of 99.0% or higher for light within the range of wavelengths of 450 nm to 800 nm.

EXPERIMENTAL EXAMPLES

Chemical Resistance Evaluation

A silicon nitride film was formed on a glass substrate, and a low refractive layer was formed on the glass substrate. The low refractive layer was heat-treated at a temperature of about 180° C. (Experimental Example 3). The glass substrate prepared in accordance with Experimental Example 3 was immersed in a 0.045% potassium hydroxide (KOH) solution for 60 seconds (Experimental Example 4).

A silicon nitride film was formed on a glass substrate, and a low refractive layer was formed on the glass substrate. The low refractive layer was heat-treated at a temperature of about 200° C. (Experimental Example 5). The glass substrate prepared in accordance with Experimental Example 5 was immersed in a 0.045% KOH solution for 60 seconds (Experimental Example 6).

A silicon nitride film was formed on a glass substrate, and a low refractive layer was formed on the glass substrate. The low refractive layer was heat-treated at a temperature of about 220° C. (Experimental Example 7). The glass substrate prepared in accordance with Experimental Example 7 was immersed in a 0.045% KOH solution for 60 seconds (Experimental Example 8).

Figure 33:
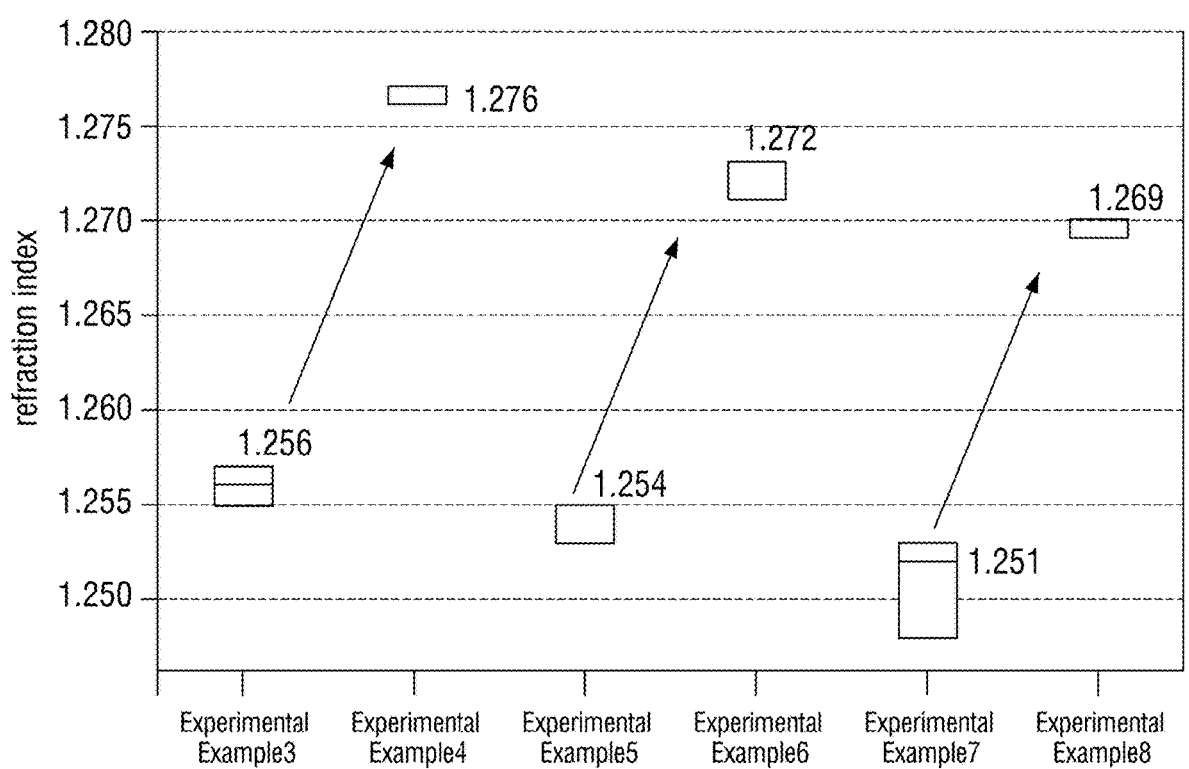
FIG. 33 shows refractive indexes of the low refractive layers of the glass substrates prepared in accordance with Experimental Examples 3 through 8.

The refractive indexes of the low refractive layers of the glass substrates prepared in accordance with Experimental Examples 3 through 8 are as shown in FIG. 33.

Referring to FIG. 33, it can be seen that an increase in the refractive index of a low refractive layer immersed in a KOH solution is insignificant (e.g., at 0.02 or lower). That is, it is clear that the low refractive layers of the display devices according to the above-described exemplary embodiments of the present disclosure have excellent chemical resistance to a developing solution such as KOH.

EXPERIMENTAL EXAMPLES

Outgassing Evaluation

Substrates were prepared in accordance with Experimental Examples 3 and 7. The thickness of the low refractive layers of the substrates prepared in accordance with Experimental Examples 3 and 7 was about 1 µm. A control substrate was heat-treated at a temperature of 230° C. to form a yellow photoresist film having a thickness of 1 µm.

Figure 34:
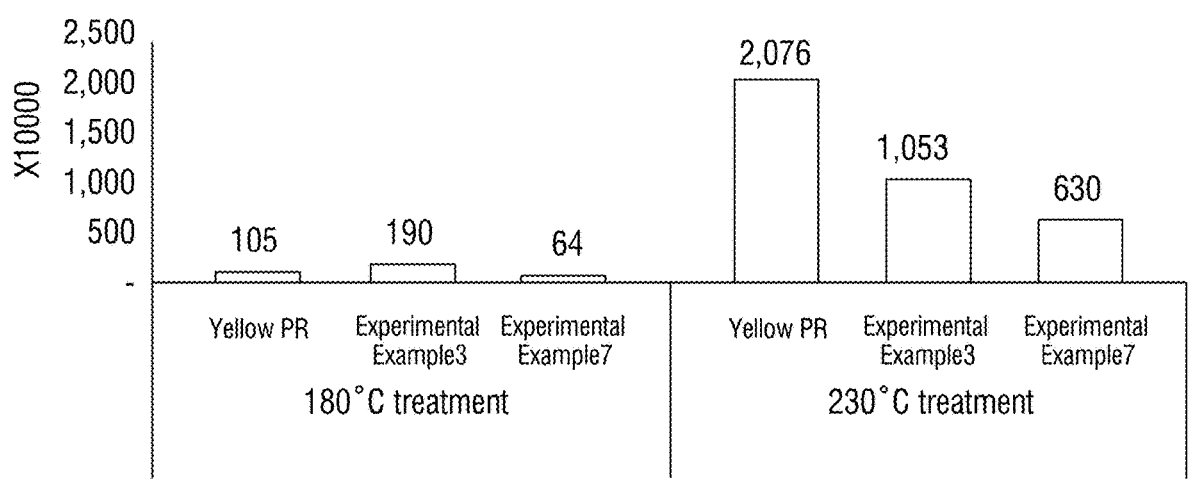
FIG. 34 shows the amount of outgassing of Experimental Examples 3 and 7 and a control substrate.

The amount of outgassing measured for cases when the substrates prepared in accordance with Experimental Examples 3 and 7 and the control substrate were subjected to subsequent heat treatment at a temperature of 180° C. and when the substrates prepared in accordance with Experimental Examples 3 and 7 and the control substrate were subjected to subsequent heat treatment at a temperature of 230° C. is as shown in FIG. 34. Specifically, the measurement of the amount of outgassing was performed by head-space-gas chromatography-mass spectrometry (HS-GC-MS) using Shimadzu's GCMS-QP2010 Ultra.

Referring to FIG. 34, it can be seen that in the case of performing subsequent heat treatment at a temperature of 180° C., the amount of outgassing from the low refractive layers of the substrates prepared in accordance with Experimental Examples 3 and 7 is not much different from the amount of outgassing from the yellow photoresist film of the control substrate. On the contrary, in the case of performing subsequent heat treatment at a temperature of 230° C., the amount of outgassing from the low refractive layers of the substrates prepared in accordance with Experimental Examples 3 and 7 is even less than the amount of outgassing from the yellow photoresist film of the control substrate.

While the present invention has been particularly illustrated and described with reference to exemplary embodiments thereof, it will be understood by those of ordinary skill in the art that various changes in form and detail may be made therein without departing from the spirit and scope of the present invention as defined by the following claims and their equivalents. The exemplary embodiments described herein should be considered in a descriptive sense only and not for purposes of limitation.

What is claimed is:

1. A display device comprising:
   a base substrate;
   a color conversion pattern on the base substrate; and
   a low refractive layer on the base substrate, stacked with the color conversion pattern, and having a lower refractive index than the color conversion pattern,
   wherein
   the low refractive layer comprises:
   a first base resin, and
   particle clusters dispersed in the first base resin and comprising a plurality of particles and bridges combining the particles.

2. The display device of claim 1, wherein
   the color conversion pattern and the low refractive layer are in contact with each other to form an optical interface,
   a surface of the low refractive layer contacting the color conversion pattern is an uneven surface, and
   the uneven surface of the low refractive layer is formed by the particle clusters.

3. The display device of claim 1, wherein
   the color conversion pattern comprises:
   a second base resin, and
   wavelength shifters dispersed in the second base resin, wherein a refractive index of the second base resin is at least 0.3 higher than the refractive index of the low refractive layer.

4. The display device of claim 1, wherein
pores are defined between the particles of the particle clusters, and
the refractive index of the low refractive layer is 1.1 to 1.4.

5. The display device of claim 1, wherein
the particles are silica particles, and
the bridges comprise polysiloxane bonds.

6. The display device of claim 5, wherein
the first base resin comprises a siloxane polymer,
a weight-average molecular weight of the siloxane polymer is about 100 to about 10,000 g/mol, and
the siloxane polymer has a fluorine-substituted side chain.

7. The display device of claim 5, wherein
the silica particles are non-hollow silica particles, and
a size of the silica particles is about 10 nm to about 30 nm.

8. The display device of claim 1, wherein
the low refractive layer comprises:
a first low refractive layer between the base substrate and the color conversion pattern, or
a second low refractive layer on the color conversion pattern.

9. The display device of claim 8, further comprising:
a first wavelength band filter between the base substrate and the first low refractive layer,
wherein the first wavelength band filter is configured to selectively absorb blue-wavelength light.

10. The display device of claim 9, wherein
the first wavelength band filter comprises an organic material, and
the first wavelength band filter is in contact with the first low refractive layer.

11. The display device of claim 10, wherein a refractive index of the first wavelength band filter is at least 0.3 higher than a refractive index of the first low refractive layer.

12. The display device of claim 8, further comprising:
a second wavelength band filter between the color conversion pattern and the second low refractive layer,
wherein
the second low refractive layer is configured to cover side surface of the color conversion pattern, and
the second wavelength band filter is configured to selectively reflect green-wavelength light or blue-wavelength light.

13. The display device of claim 12, wherein
the second wavelength band filter is a Bragg reflector comprising one or more first inorganic layers and one or more second inorganic layers alternately stacked, and
the second wavelength band filter is in contact with the color conversion pattern and the second low refractive layer.

14. The display device of claim 13, wherein
the first inorganic layers have a refractive index of 1.7 or higher,
the second inorganic layers have a refractive index of 1.5 or lower, and
a lowermost layer of the second wavelength band filter in contact with the color conversion pattern and an uppermost layer of the second wavelength band filter in contact with the second low refractive layer both comprise the first inorganic layers.

15. The display device of claim 8, wherein
the display device further comprises:
a first pixel to display a first color and a second pixel to display a second color different from the first color, and
an organic layer on the second low refractive layer and comprising an organic material,
wherein the first low refractive layer, the second low refractive layer, and the organic layer are all across the first and second pixels.

* * * * *